(12) United States Patent
Kawamura et al.

(10) Patent No.: US 7,291,427 B2
(45) Date of Patent: Nov. 6, 2007

(54) SURFACE GRAFT MATERIAL, CONDUCTIVE PATTERN MATERIAL, AND PRODUCTION METHOD THEREOF

(75) Inventors: Koichi Kawamura, Shizuoka-ken (JP); Takeyoshi Kano, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 298 days.

(21) Appl. No.: 11/084,046

(22) Filed: Mar. 21, 2005

(65) Prior Publication Data

US 2005/0208428 A1    Sep. 22, 2005

(30) Foreign Application Priority Data

| Mar. 19, 2004 | (JP) | ............................ 2004-081482 |
| Mar. 25, 2004 | (JP) | ............................ 2004-090151 |
| Mar. 25, 2004 | (JP) | ............................ 2004-090152 |

(51) Int. Cl.
  *G03F 7/039* (2006.01)
  *G03F 7/09* (2006.01)
  *G03F 7/16* (2006.01)
  *G03F 7/40* (2006.01)

(52) U.S. Cl. ..................... 430/15; 430/16; 430/271.1; 430/291; 430/315

(58) Field of Classification Search ................. 430/15, 430/16, 291, 315, 270.1, 271.1
See application file for complete search history.

(56) References Cited

U.S. PATENT DOCUMENTS 6,878,470 B2 *  4/2005  Kawamura et al. ......... 428/690
2001/0019760 A1 *  9/2001  Kawamura .................. 428/195
2003/0068581 A1 *  4/2003  Kawamura et al. ......... 430/315
2003/0149187 A1 *  8/2003  Kano et al. ............... 525/328.2
2004/0001947 A1 *  1/2004  Kawamura et al. ......... 428/327

FOREIGN PATENT DOCUMENTS

| JP | 11-119413 A    | 4/1999  |
| JP | 2003-188498 A  | 7/2003  |
| JP | 2003-234561 A  | 8/2003  |
| JP | 2003-345038 A  | 12/2003 |
| JP | 2004-31588 A   | 1/2004  |

OTHER PUBLICATIONS

Yasuhide Nakayama, James M. Anderson, Takehisa Matsuda; Laboratory-Scale Mass Production of a Multi-Micropatterned Grafted Surface with Different Polymer Regions; "Journal of biomedical materials research", 53, pp. 584-591, (2000).

(Continued)

*Primary Examiner*—Richard L. Schilling
(74) *Attorney, Agent, or Firm*—Sughrue Mion, PLLC

(57) ABSTRACT

A surface graft material including a substrate and a surface graft polymer chain, wherein the surface graft polymer chain includes a photocleavable moiety at one of its terminals, and the surface graft polymer chain is directly bonded to a surface of the substrate by a covalent bond between the photocleavable moiety and the substrate. A graft pattern formation method comprising exposing the graft material to cleave the photocleavable moiety in the exposed area, and removing the graft polymer chain from the exposed are to form a surface graft polymer chain pattern. A conductive pattern material and a metal particle pattern material using the graft pattern.

21 Claims, 1 Drawing Sheet

OTHER PUBLICATIONS

Y. Nakayama and T. Matsuda, Surface Macromolecular Microarchitecture Design: Biocompatible Surfaces via Photo-Block-Graft-Copolymerization Using N,N-Diethyldithiocarbamate; "Langmuir", 15, pp. 5560-5566, (1999).

Nig Luo, Andrew T. Metters, J. Brian Hutchison, Christopher N. Bowman and Kristi S. Anseth; A Methacrylated Photoiniferter as a Chemical Basis for Microlithography: Micropatterning Based on Photografting Polymerization, "Macromolecules", 36, pp. 6739-6745, (2003).

Rahul R. Shah, David Merreceyes, Marc Husemann, Ian Rees, Nicholas L. Abbott, Craig J. Hawker, and James L. Hedrick; Using Atom Transfer Radical Polymerization To Amplify Monolayers of Initiators Patterned by Microcontact Printing into Polymer Brushes for Pattern Transfer, "Macromolecules", 33, pp. 597-605, (2000).

* cited by examiner

SURFACE GRAFT MATERIAL, CONDUCTIVE PATTERN MATERIAL, AND PRODUCTION METHOD THEREOF

CROSS-REFERENCE TO RELATED APPLICATION

This application claims priority under 35 USC 119 from Japanese patent Application Nos. 2004-081482, 2004-090151, and 2004-090152, the disclosures of which are incorporated by reference herein.

BACKGROUND OF THE INVENTION

1. Field of the Invention

The present invention is concerned with a surface graft material, a conductive pattern material, a metal particle pattern material, and a method of forming a graft pattern, a conductive pattern or a metal particle pattern.

2. Description of the Related Art

Surface modification of solid surface with a polymer can alter properties such as the wettability, stain resistance, adhesiveness, surface friction, and affinity for cells. Therefore, the surface modification has been widely studied in various industrial fields. Particularly, the surface modification with a surface graft polymer directly connected to a solid surface through a covalent bond has gathered attention. This is because the bond between the surface and the polymer is advantageously strong, the affinity of a graft polymer for a substance is different from the affinity of a polymer formed by a general coating and cross-linking method, and the graft polymer exhibits specific properties.

Applied technologies have been proposed which use the surface graft polymers having such advantages in various fields such as a field of living bodies (cell cultures, anti-thrombotic artificial blood vessels, artificial joints, etc.) hydrophilic films whose surface has to have high hydrophilicity, and hydrophilic supports of printing plates whose surface has to have high hydrophilicity. These applications utilize the specific properties of the graft polymers.

Furthermore, when such a surface graft polymer is formed in pattern, the specific properties of the graft polymer can be exhibited according to the pattern. Therefore, the graft polymers are used in fields of printing plate precursors, compartmentalized cultures and dye image formation.

For instance, it has been reported that a hydrophilic graft pattern is formed by using a polymerization initiating group (called "iniferter") fixed on a surface, and used as a cellular compartmentalized culture material (Matuda et al. "Journal of biomedical materials research", 53, 584 (2000)). It has also been reported that a dye is adsorbed by the graft pattern to form a visible image pattern (Matuda et al. "Langumuir", 15, 5560 (1999)).

Furthermore, the following methods have been reported. One method comprises polymerizing a hydrophilic or hydrophobic monomer in pattern to obtain a polymer pattern by using an iniferter polymerization initiator fixed on the surface, and grafting a monomer having a dye structure to form a dye polymer pattern (A. T. Metters et al. "Macromolecules", 36, 6739 (2003)). Another method comprises imagewise attaching an initiator onto a gold plate using a micro-contact printing method, causing an atom transfer polymerization (ATRP polymerization) from the initiator to form a graft polymer of HEMA (hydroxy ethyl methacrylate) or MMA (methyl methacrylate) in pattern, and using the obtained pattern as a resist (C. J. Hawker "Macromolecules", 33, 597 (2000)).

According to these methods, the obtained pattern has a relatively low resolution at a level of 10 to 100 μm. However, generally, it has been difficult to form a pattern having higher resolution at a level of 0.10 to 10 μm. One of the reasons is considered as the following. These methods utilizes a surface graft reaction to generate graft polymers locally. Specifically, the methods comprise bringing monomers that generate grafts into contact with the surface of a base material, pattern-exposing the monomers to form graft polymers bonded to the base material in the exposed portions. However, at the exposure, free monomer molecules polymerize to form a large amount of homopolymers, which are bi-products, in addition to the formation of the graft polymers bonded to a substrate. These homopolymers are removed from the substrate by washing and the like. However, in the case of a fine pattern, it is difficult to completely remove the homopolymers present between the formed graft polymer patterns, and the resolution of the pattern is lowered.

Furthermore, the monomer used in the graft formation is generally in the state of a solution. Since the monomer is often harmful to the human body, it has been necessary to form a pattern in an environment equipped with a sufficiently powerful exhaust system.

Another proposed graft pattern forming method comprises providing an ablation polymer layer containing a photothermal conversion agent on a substrate surface, forming a graft polymer of a hydrophilic monomer such as acrylamide on the surface of the ablation polymer layer, causing ablation in the exposed areas by using an infrared laser, removing the graft polymer together with the ablation polymer to form a hydrophilic-hydrophobic pattern, and applying the pattern to a printing plate (Japanese Patent Application Laid-Open (JP-A) No. 11-119413). According to the method, there is no problem caused by the homopolymer during image formation. However, this method involves environmental problems such as diffusion of the decomposed products of the ablation polymer layer into the air. Moreover, it is hard to reduce the spot diameter of the infrared laser used in the pattern formation to 10 μm or less. Accordingly, it is difficult to form a fine pattern by the method.

As recited above, a pattern formation material and a pattern formation method have not been obtained which is capable of forming a polymer pattern with a high resolution at the level of 0.1 to 10 μm, and which are required for obtaining an effective surface modifying material and a highly functional material by modification of a solid surface with a polymer.

So far, various kinds of conductive pattern materials are used in the formation of wiring boards. Typical conductive patterns are formed by providing a conductive substance thin film prepared by a known method such as a vapor deposition method on an insulator, subjecting the conductive substance to a resist treatment, conducting a pattern-exposure, partially removing the resist, and conducting an etching treatment to form a desired pattern. The method includes at least four steps. When a wet etching is carried out, the waste liquid of the wet etching has to be suitably processed. Therefore, the method involves complicated processes (JP-A No. 2004-31588).

Another pattern formation method is known which involves use of a photoresist to form a conductive pattern material. The method comprises coating a base material with a photoresist polymer or attaching a photoresist on a dry film to a base material, exposing the photoresist with an arbitrary photomask to UV to form a pattern such as a lattice pattern.

The method is useful for forming an electromagnetic wave shield which has to have a high conductivity.

The development of micromachines have progressed and ULSI (Ultra Large-Scale Integration) have been further downsized in recent years. Accordingly, a wiring structure thereof has to be fine at a nanometer level. The ability of the conventional metal etching to form fine wiring structure is limited and breaking of wire during processing of fine wires is likely to occur. Accordingly, there have been needs for a pattern formation method which is capable of forming a fine pattern whose orientation is controlled.

Further, various methods have been recently proposed which form patterns directly from digital data without using masks or the like. It is expected that fine patterns can be formed arbitrarily by using such methods. An example of such method uses a self-assembling monomolecular film. The method utilizes a molecular assembly which is spontaneously formed when a substrate is immersed in an organic solvent containing surfactant molecules. The combination of the material and the substrate may be, for instance, a combination of an organic silane compound and a $SiO_2$ or $Al_2O_3$ substrate, or a combination of alcohol or amine and a platinum substrate. According to this method, patterns can be formed by the photolithography method or the like. Such monomolecular films enable to form a fine pattern. However, such a method is difficult to put into practice since the combination of the substrate and the material is limited. Accordingly, pattern formation techniques have not been developed which can be practically applied to form fine wiring.

In order to obtain a pattern material which is light, flexible, and friendly to the environment, organic transistors using a conductive polymer pattern have been studied. The supports comprising such organic materials are capable of easily forming (by a technique similar to printing at room temperature) an element which is light, thin, and flexible and which has a large area. Such features of the organic materials can be combined with electrical and optical characteristics of organic semiconductors which are under development. Such combinations are expected to enhance the development of a technology for the personalization of information, which is most strongly required in the present information technology. An example of the technology for the personalization is a technique of manufacturing wearable portable terminals with simple information processing functions and easily operable I/O functions. However, the technique has insufficient characteristics from the practical viewpoints of the durability, area expandability, stability in conductivity and productivity.

It has also been proposed to form a conductive pattern by using a highly hydrophilic graft polymer. An example of the methods comprises providing a hydrophobic compound in pattern on a surface having a hydrophilic graft polymer on its entire surface to form a hydrophilic-hydrophobic pattern, and attaching a conductive substance to hydrophilic graft regions (JP-A No. 2003-345038). Another example comprises forming a hydrophilic graft polymer on the entire surface of a base material, and attaching a conductive substance in pattern on the surface by inkjet or the like (JP-A No. 2003-234561). Another example comprises forming a graft polymer locally on the surface of a base material to form a hydrophilic graft polymer pattern, and attaching a conductive polymer to the hydrophilic graft portion (JP-A No. 2003-188498). All of these methods have an advantage that a pattern can be easily formed based on the digital data. However, the resolution of the pattern is insufficient. In the first and second examples, the resolution is limited at the process of attaching a conductive substance in pattern. In the third example, a graft polymer is locally formed by using a surface graft reaction. However, free monomers polymerize to form a lot of by-product homopolymers in addition to the formation of graft polymers bonded to a substrate during the formation of the graft polymer. If the pattern is fine, the homopolymers present among graft polymer patterns is hard to remove completely. Therefore, the resolution of the pattern is insufficient.

Not only a continuous metal thin film but also a fine metal particle pattern has attracted attention in which metal particles are adsorbed selectively to specific areas. In recent years, the society has become an advanced information society, and electronic devices have developed remarkably. In particular, the development of the computer technology supports the advanced information society. Factors which develop the computer technology include higher integration of semiconductor LSIs and a higher recording density of magnetic discs. In realizing the higher recording density of the magnetic disc, the defects in the magnetic layer has to be minimized and the smoothness of the layer has to be improved. In order to realize these objects, a film has been used in which metal particles having magnetic characteristics are dispersed on the surface of a base material. It is known that the recording capacity can be increased when the metal particles are patterned. Therefore, it has become important to dispose the metal particle adsorption region in pattern. The formation of the fine metal particle pattern for increasing the recording density also has problems similar to in the case of the metal thin film pattern. Accordingly, it has been difficult to form a metal particle pattern which is fine and which has a high resolution.

SUMMARY OF THE INVENTION

A first aspect of the present invention is to provide a surface graft material comprising a substrate and a surface graft polymer chain. The surface graft polymer comprises, at one terminal thereof, a moiety which can be photocleaved. The moiety is covalently bound to the surface of the substrate, so that the graft polymer chain is directly bound to the surface of the substrate.

A second aspect of the invention is to provide a graft pattern formation method comprising exposing the surface graft material described in the first aspect so as to cleave the photocleavable moiety in the exposed area, and removing the surface graft polymer from the exposed area so as to form a surface graft polymer chain pattern. This pattern is formed by regions on which the graft polymer chain is present and regions on which the graft polymer chains is not present.

The surface graft material comprises a substrate and a graft polymer chain directly bound to the substrate by a covalent bond. The graft polymer chains are formed on the entire surface of the substrate. The linking group which connects the substrate and the main structure of the graft polymer includes a photocleavable moiety. Since the entire surface of the substrate is converted to a graft surface, homopolymers generated during the graft reaction can be easily removed. Accordingly, a by-product homopolymers do not remain in the space in the graft pattern. The remaining by-product homopolymers have been a big problem when the graft surface is formed locally by a conventional technique. However, according to the present invention, such a problem does not occur as recited above. The graft polymer chains on the entire surface is then subjected to an exposure. The photocleavable moiety is cleaved at the exposure and the graft polymer chain is separated from the substrate and removed. The graft pattern is formed in this way. Since the pattern formation is conducted by an irradiation with a light, a desired fine pattern can be formed by using known optical devices.

In conventional methods comprising bringing a monomer into contact with a substrate and exposing the monomer to form a graft pattern, the monomer has to be coated before every pattern exposure, and the process is troublesome. However, by using the surface graft material of the invention, a graft pattern having a high resolution can be easily formed without special devices. Since it is necessary only to conduct a pattern exposure, the productivity can be remarkably improved when the surface graft material of the invention is used.

A third aspect of the invention is to provide a conductive pattern obtained by: forming the graft polymer chain pattern as described in the second aspect and adhering a conductive substance to regions on which the graft polymer chains are present.

A fourth aspect of the invention is to provide a conductive pattern formation method comprising forming the graft polymer chain pattern as described in the second aspect and adhering a conductive substance to regions on which the graft polymer chains are present.

If a hydrophilic group is included in the graft polymer chain, the regions on which the graft polymers are present are hydrophilic regions having highly mobile hydrophilic graft chains.

If a conductive substance which can selectively adhere to a specific functional group in the graft polymer chain is provided on the graft pattern, the conductive substance adheres to the region on which the graft polymer chains are present and forms a conductive region. The conductive substance does not attach to the region where the graft polymer is not present, thus a non-conductive region is formed. A conductive pattern (circuit) can be formed in this way.

There is no particular restriction on the mechanism of the adhesion of the conductive substance. Examples of the mechanism usable in the invention include an ionic adsorption (such as by a polar group or by an ionic group), an electrostatic adsorption, an electrostatic adhesion, an adsorption caused by a dipolar interaction and an adhesion caused by a dipolar interaction.

It is considered that, according to the invention, the conductive region has excellent durability and stable conductivity since the conductive substance adheres strongly and ionically to the functional group on the hydrophilic graft chain and forms a monomolecular film or a polymer layer.

A fifth aspect of the invention is to provide a conductive pattern material or a metal particle pattern material obtained by: forming the graft polymer chain pattern described in the second aspect, providing a metal ion or a metal salt on the region where the graft polymer chains are present, reducing the metal ion or the metal ion in the metal salt to cause metal deposition, and optionally heating the metal. The method produces metal particles by the reduction, thus forms a metal particle adsorption region, or produces a metal thin film.

A sixth aspect of the invention is to provide a graft pattern formation method comprising forming the graft polymer chain pattern described in the second aspect and forming a metal thin film or a metal particle adsorption region in accordance with the pattern. Specifically, the method comprises forming the graft polymer chain pattern described in the second aspect, providing a metal ion or a metal salt on the region where the graft polymer chains are present, reducing the metal ion or the metal ion in the metal salt to cause metal deposition in the form of a metal particle or a metal thin film. The metal thin film and the metal particle adsorption region are formed in this way. In the formation of the conductive pattern, heating treatment may be conducted at a temperature of 100 to 400° C. after the reduction of the metal ion.

A seventh aspect of the invention is to provide a conductive pattern material. A surface graft material is used for the production of the conductive pattern material. The surface graft material comprises a substrate and a graft polymer including a photocleavable moiety. The photocleavable moiety is covalently bound to the substrate so that the graft polymer is directly bound to the substrate. The graft polymer further includes a functional group which is capable of interacting with an electroless plating catalyst or a precursor thereof. The conductive pattern material is obtained by: exposing the surface graft material so as to cleave the photocleavable moiety in the exposed area, removing the graft polymer chains from the exposed area to form a graft polymer chain pattern, providing an electroless catalyst or a precursor thereof on the unexposed area in the pattern, and conducting electroless plating to form a metal thin film. The graft polymer chain pattern is formed by regions on which the graft polymer chains are present and regions on which the graft polymer chains are not present.

An eighth aspect of the invention is to provide a conductive pattern formation method comprising exposing the surface graft material described in the seventh aspect so as to cleave the photocleavable moiety in the exposed area, removing the graft polymer chains from the exposed area to form a graft polymer chain pattern, providing an electroless catalyst or a precursor thereof on the unexposed area in the pattern, and conducting electroless plating to form a metal thin film.

Since a specific surface graft material including the photocleavable moiety is used, the graft polymer chains are removed from the exposed area, and the metal thin film or the metal particle adsorption region is formed on the region on which the graft polymer chains are present. Accordingly, a metal (particle) adsorption pattern with a high resolution can be obtained by a scanning exposure based on digital data or a pattern exposure with a predetermined mask pattern.

In the surface graft material, the graft polymer chain is bonded to the support through a structure including the photocleavable moiety at a terminal of the chain. A metal ion or a metal salt can adhere to the region on which the graft polymer chain directly bonded to the substrate is present. The metal ion or the metal ion in the metal salt is reduced to deposit the metal, so that a continuous metal thin film region or a metal particle adsorption region in which metal particles are dispersed and adsorbed is formed. Accordingly, the metal thin film or the metal particle adsorption region has a high strength and wear resistance, and a wiring formed by the continuous metal film also has a high strength and wear resistance. The conductive substance described in the seventh aspect has excellent properties as recited above.

As a result, it is possible to form a metal thin film or a thin metal particle adsorption pattern having a high definition and high strength. The metal salt is ionically adhered (adsorbed) to the functional group such as a hydrophilic group which has an affinity for a metal ion or a metal salt and firmly fixed. Therefore, the resultant metal region has a high strength even if the thickness is small. When the metal regions are continuous, a fine wiring pattern can be formed which is free from breaking of wire.

In the invention, the following methods may be applied for adhering the metal ion or metal salt. (1) a method comprising allowing a hydrophilic graft polymer chain including a polymerization component having an ionic group to adsorb the metal ion, (2) a method comprising impregnating the region where a graft polymer chain comprising a polymerization component (such as polyvinyl pyrrolidone) having a high affinity for metal salts is present with a metal salt or a solution containing a metal salt, and (3) a method comprising impregnating a region where a graft polymer chain is present with a solution containing a metal salt or a solution in which a metal salt is dissolved. According to the method (3), a necessary metal ion or metal salt can be adhered even when the compound that forms a region where the graft polymer chains are present is positively charged.

In the third pattern formation method, the functional group (such as a hydrophilic group) having an affinity for metal ions or metal salts is included in the highly mobile graft chain structure. Therefore, the adsorption rate is very high and the amount of metal ions or metal salts absorbable by a unit area is large, when compared with a case where a general cross-linked polymer film is allowed to adsorb a metal salt.

Accordingly, a fine wiring pattern can be formed when an amount of adsorbed metal is controlled so as to form a continuous metal thin film or a dense metal particle adsorption layer is heated to fuse adjacent particles to form a continuous metal layer. When such a wiring is formed, the conductivity is not disturbed by a gap between metal particles and the disconnection does not occur. By using the conductive pattern material of the invention, a fine wiring can be formed even if the thickness of the pattern formation layer is reduced to obtain a higher sensitivity. Further, the film is highly durable even if the film thickness is small since the graft polymer chains forming the pattern is directly bound to a support by a chemical bond. The metal particle pattern material of the invention is also durable with a small thickness of the metal particle adsorption layer, by the similar mechanism to the mechanism described above.

DETAILED DESCRIPTION OF THE INVENTION

In the following, the present invention will be detailed.

The surface graft material of the invention comprises a substrate and a surface graft polymer chain whose one terminal is directly bonded to the surface of the substrate by a covalent bond, wherein the terminal bonded to the substrate includes a photocleavable moiety. Such a surface graft material can be manufactured by: bringing a monomer into contact with the surface of the support, allowing the monomer to polymerize by heating the monomer or by using a catalyst to form a graft polymer over the entire surface of the support. Homopolymers are also produced which do not bound to the substrate and which are by-products. The amount of the homopolymers is considered to be about 100 times the amount of the graft chains bound to the surface of the support. After the surface graft generation, the homopolymers are removed and the surface graft is purified to obtain a surface graft material.

A conductive pattern material (R) of the invention is obtained by: imagewise exposing the surface of the surface graft material to form a patterned graft polymer chain region and adhering a conductive substance to the region.

A conductive pattern material (S) and a metal particle pattern material of the invention are obtained by: imagewise exposing the surface graft material to cause cleavage of the photocleavable moiety in the exposed area, removing the graft polymer chains from the exposed area to form a graft polymer chain pattern, adhering a metal ion or a metal salt to the graft polymer chain region in the graft polymer chain pattern, reducing the metal ion or the metal ion in the metal salt to form a metal thin film or a metal particle adsorption region. Firstly, the surface graft material will be explained.

[Surface Graft Material]

The surface graft material includes a characteristic bonding portion between the substrate and the graft polymer chain. The following are typical examples of the method for producing a surface graft having such a bonding portion.

(1) Method of Modifying Surface of Substrate

Figure 1:
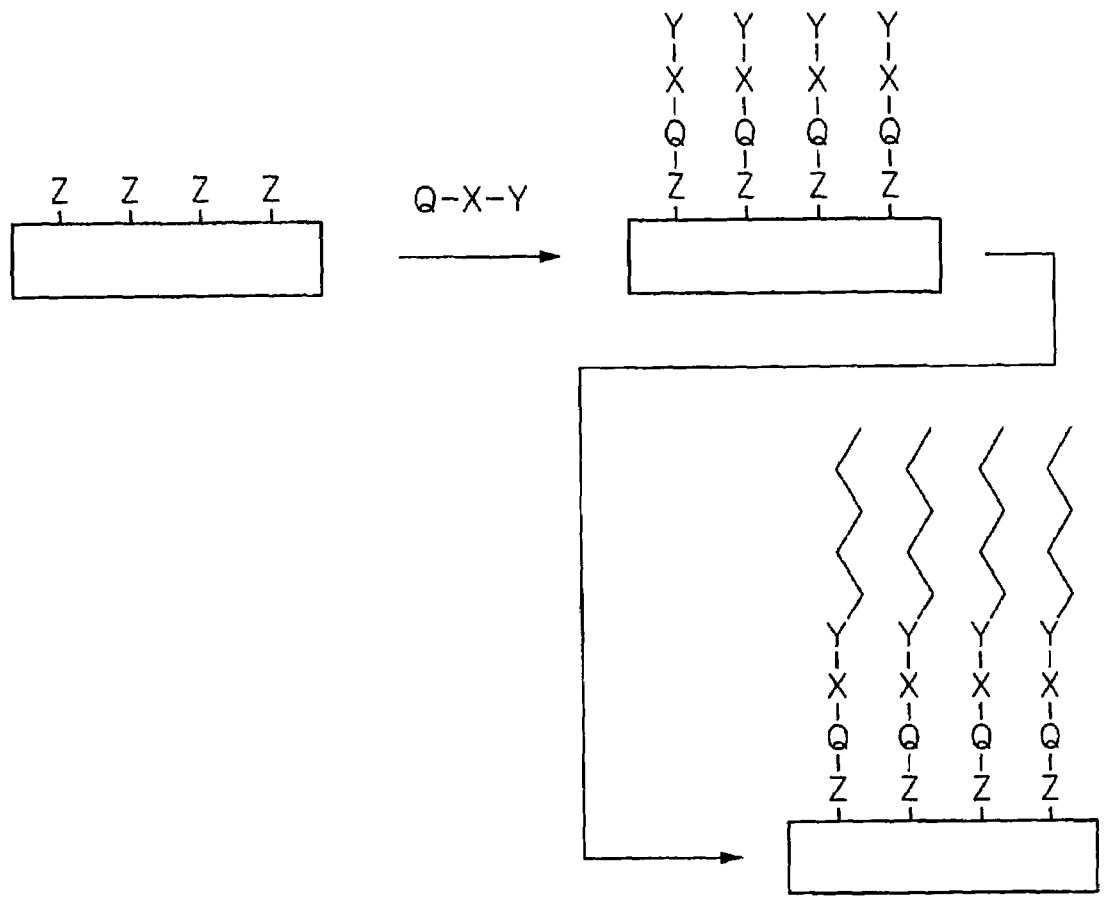
FIG. 1 shows a schematic diagram illustrating a method comprising modifying the surface of a substrate, and forming a graft polymer chain by using the surface as a starting point so as to form a surface graft material.

The method comprises modifying the substrate surface by introducing a specific linkage portion having, at a terminal thereof, an initiating capability into the surface of the substrate, and generating a graft by using the portion having the initiating capability as a starting point. FIG. 1 is a schematic diagram illustrating the method.

On the surface of the substrate, there are functional groups (represented by Z in the figure) from the beginning. Z will be described in detail later. Z may be a functional group present from the beginning on the surface of the substrate or a functional group generated by a surface treatment on the substrate such as the corona discharge. A compound (Q-X-Y) has a substrate binding group (Q) capable of binding to the substrate and a polymerization initiating group (Y) at terminals, and an photocleavable moiety (X) between the terminals. The compound (Q-X-Y) is introduced by allowing the substrate binding group (Q) to bind to the functional group (Z) on the surface of the substrate. Thereafter, a known graft polymer raw material such as a monomer is brought into contact with the surface, so that polymerization initiating group (Y) functions as the starting point of the polymerization and that a graft polymer chain is generated. The surface graft material is obtained in this way.

(2) Method of Using Polymer Having Specific Linkage Portion

Figure 2:
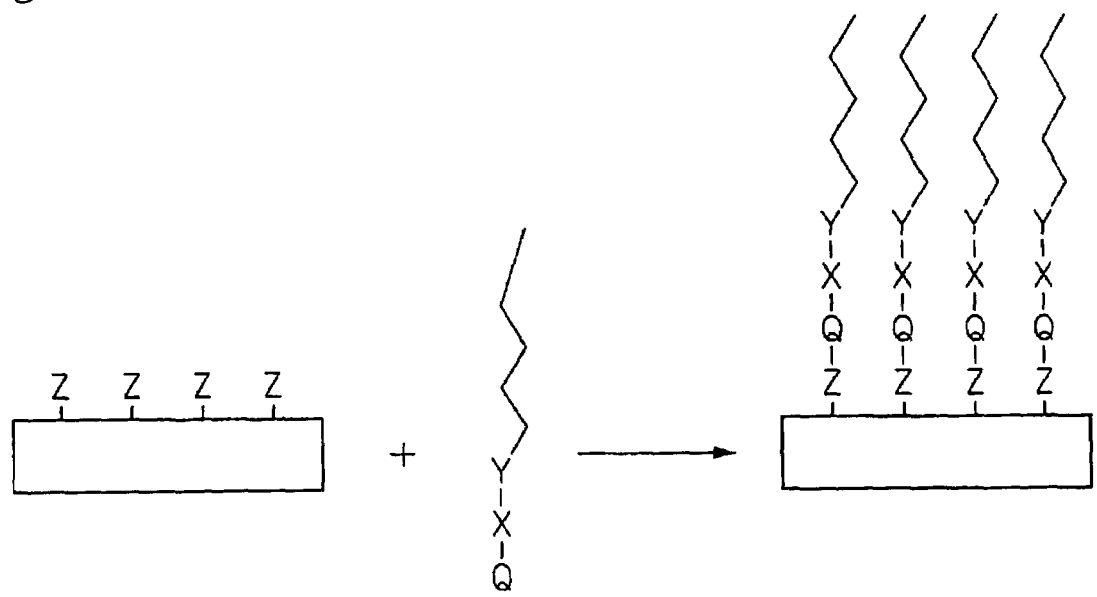
FIG. 2 shows a schematic diagram illustrating a method comprising introducing a graft polymer having a specific linkage portion into the surface of a substrate to form a surface graft material.

This is a method comprising preparing a polymer having a specific linkage portion whose terminal has a capability of binding to the substrate, and binding the polymer to the substrate by utilizing the binding capability of the terminal. FIG. 2 is a schematic diagram illustrating the method.

On the surface of the base material, there are functional groups (represented by Z in the figure) from the beginning. A compound (Q-X-Y) includes a substrate binding group (Q) and a polymerization initiating group (Y) at terminals and a photocleavable moiety (X) between the terminals. Using the polymerization initiating group (Y) as a starting point, polymerization is conducted to form a graft polymer chain. Then, the polymer is bound to the substrate by the formation of a bond between the substrate binding group (Q)

and the functional group (Z) on the surface of the substrate. The surface graft material is obtained in this way.

In the following, a process for preparing such a surface graft material will be explained specifically.

The group represented by Z in FIGS. 1 and 2 is a functional group on the surface of the substrate and may be, for instance, a hydroxyl group, carboxyl group, or an amino group. The functional group may be derived from the substrate material (such as a silicon substrate or a glass substrate) or may be generated by application of a surface treatment such as the corona discharge on the surface of the substrate.

In the next place, the structure of the compound having a photocleavable moiety will be described in detail. As an exemplary model, a compound (Q-X-Y) will be explained in detail which has a substrate binding group (Q) having a capability of binding to the substrate and a polymerization initiating group (Y) at terminals thereof, and which has a photocleavable moiety (X) between the terminals. In general, X is a moiety including a photocleavable single bond. Q is a reactive group that can react with the functional group Z on the surface of the substrate to form a bond. Examples of Q include the following groups.

Q: substrate binding group

Y is a polymerization initiating group. In order to utilize the photocleavability of the photocleavable moiety effectively, in the invention, the polymerization initiating group is preferably a polymerization initiating group that can initiate the polymerization by other ways than light. Y may be, for example, a functional group such as a thermal polymerization initiating moiety or a living radical initiating moiety which can initiate a polymerization such as an atom transfer polymerization, RAFT polymerization and iniferter polymerization. Examples of Y include groups shown below.

Y: polymerization initiating group

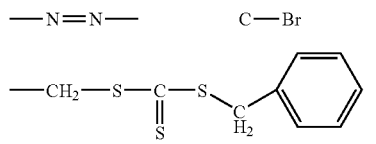

X may be a photocleavable moiety utilizing an α-cleavage reaction of carbonyl, a β-cleavage reaction of carbonyl, a light free rearrangement reaction, a rearrangement of benzyl ester, or a cleavage reaction of phenacyl ester. By such a reaction, the photocleavable single bond is cleaved. In the following examples 1 to 4 of the photocleavable moiety, such a reaction is utilized and the single bond in each structure is cleaved at the wavy line.

Other examples of X include a cleavable moiety utilizing a bond cleavage reaction such as a sulfonimide cleavage reaction, a sulfonyl ester cleavage reaction, a N-hydroxysulfonyl ester cleavage reaction, an α-ketosulfonate cleavage reaction, or a ketosulfone cleavage reaction. Examples 5 to 10 of the photocleavable moiety shown below utilize such reactions. The single bond in each structure is cleaved at the wavy line.

X: photocleavable moiety

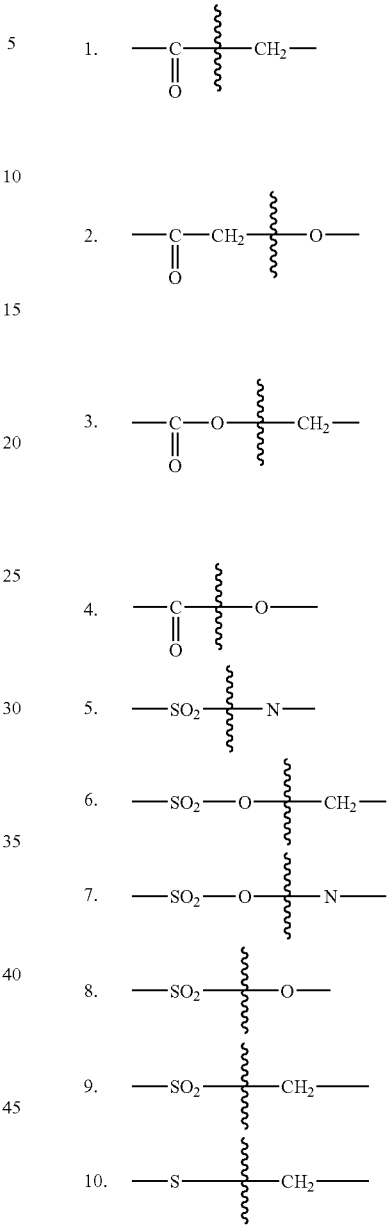

Specific examples (exemplary compounds 1 to 10) of the compound (Q-X-Y) are shown below with reaction mechanisms of the respective functional groups; however, the examples should not be construed as limiting the invention.

The compound (Q-X-Y) can be synthesized by various methods. Examples thereof include a method comprising connecting the photocleavable moiety and the polymerization initiating moiety and connecting the substrate binding group to the photocleavable moiety, a method comprising introducing the photocleavable moiety when connecting the substrate binding group and the polymerization initiating moiety, and a method comprising connecting the substrate binding group and the photocleavable moiety, then connecting the polymerization initiating moiety to the photocleavable moiety.

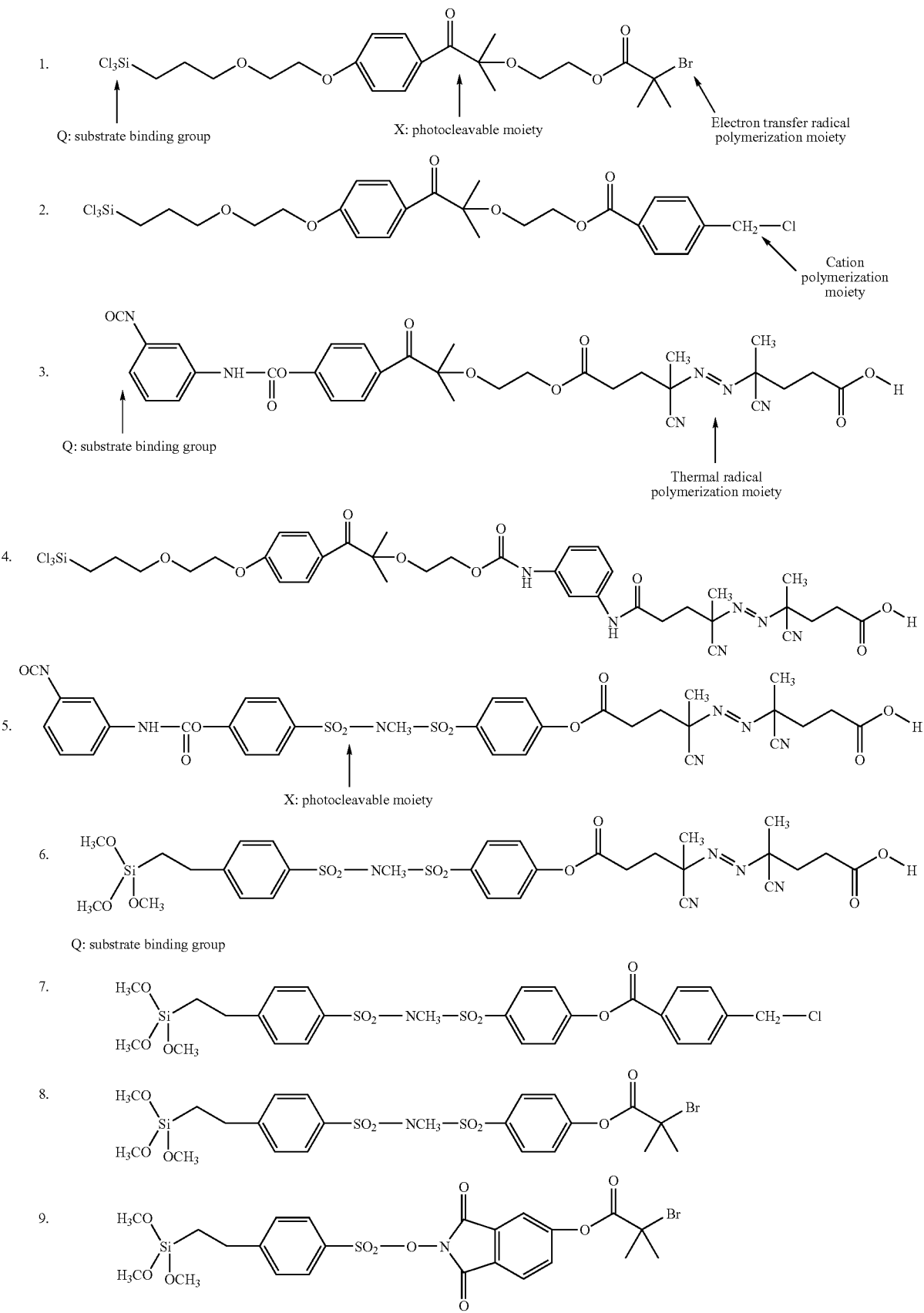

-continued

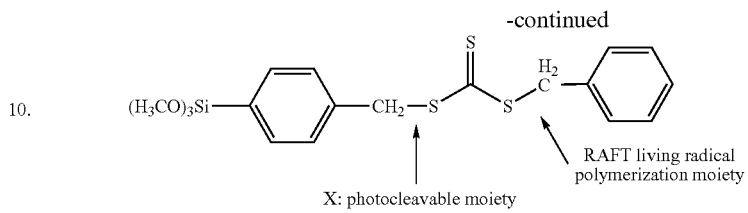

10.

X: photocleavable moiety

RAFT living radical polymerization moiety

In the above-mentioned method (1), the substrate binding group Q of the compound (Q-X-Y) is bonded to the functional group Z present on the surface of the substrate, so that the compound is introduced into the surface of the substrate. Then, graft is produced using the polymerization initiating group Y as the starting point according to a known method. The surface graft material of the invention can be obtained in this way.

The following method may be used in order to bind the compound (Q-X-Y) to the functional group Z. One method called "a chemical adsorption method" comprises dissolving or dispersing the compound (Q-X-Y) in a suitable solvent such as toluene, hexane or acetone and bringing the solution or dispersion into contact with the surface of the substrate. Another method called "a gas phase method" comprises heating the compound (Q-X-Y) so as to vaporize the compound and allowing the vapor to react with the surface of the substrate. The gas phase method is conducted preferably at a heating temperature of 50 to 300° C. When the chemical adsorption method is applied, the concentration of the compound (Q-X-Y) in the solution or dispersion is preferably in the range of 0.01 to 10% by mass, the liquid temperature at the contact with the substrate is preferably in the range of 0 to 100° C. and the contact time is preferably in the range of 1 min to 50 hrs.

The following exemplary method may be used for forming the graft with the polymerization initiating group Y as the starting point: the method comprises immersing the compound (Q-X-Y) fixed on the substrate in a dispersion liquid including dissolved or dispersed monomers such as a monomer having a hydrophilic group, and applying energy in other ways than irradiation with light. Usually, the substrate itself is immersed in the dispersion liquid. When the energy is applied, the polymerization initiating group Y is activated to cause a graft reaction using compounds (such as a hydrophilic monomer) having a polymerizable group in the liquid.

Specific embodiments of the surface graft polymerization will be explained. In the conductive pattern formation method or the metal particle pattern formation method of the invention, the graft polymer chain has a functional group having an affinity for the conductive substance, the metal ion or the metal salt, or has a functional group that interacts with the electroless plating catalyst or a precursor thereof described below. In the following, specific explanation is given using, as an example, graft polymers having hydrophilic groups, which are a typical example of such functional groups.

(Hydrophilic Monomer Having Polymerizable Group)

The hydrophilic monomer (hereinafter, referred to as "polymerizable-group-containing hydrophilic monomer") having a polymerizable group used for the generation of a graft polymer means a monomer including a hydrophilic functional group and an ethylenic addition polymerizable unsaturated group such as a vinyl group, allyl group or (meth)acryl group.

Examples of the hydrophilic functional group include: a carboxylic group, a sulfonic group, a sulfinic group, a phosphonic group, and an amino group; salts thereof; an amide group, a hydroxyl group, an ether group; and a polyoxyethylene group.

Specific examples of useful polymerizable-group-containing hydrophilic monomer include: (meth)acrylic acid, alkaline metal salts thereof, and amine salts thereof; itaconic acid, alkaline metal salts thereof, and amine salts thereof; allyl amines and hydrogen halide salts thereof; 3-vinyl propionic acid, alkaline metal salt thereof, and amine salts thereof; vinyl sulfonic acid, alkaline metal salts thereof, and amine salts thereof; styrene sulfonic acid, alkaline metal salts thereof, and amine salts thereof; 2-sulfoethylene (meth)acrylate, 3-sulfoprpyrene (meth)acrylate, alkaline metal salts thereof, and amine salts thereof; 2-acrylamide-2-nethylpropane sulfonic acid, alkaline metal salts thereof, and amine salts thereof; acid phosphooxypolyoxyethyleneglycol mono(meth)acrylate and salts thereof; 2-dimethylaminoethyl (meth)acrylate and hydrohalic acid salts thereof; 3-trimethylammoniumpropyl (meth)acrylate, 3-trimethylammoniumpropyl (meth)acrylamide, and N,N,N-trimethyl-N-(2-hydroxy-3-methacryloyloxypropyl)ammonium chloride; 2-hydroxyethyl (meth)acrylate, (meth)acrylamide, N-monomethylol(meth)acrylamide, N-dimethylol(meth)acrylamide, N-vinylpyrrolidone, N-vinylacetamide, and polyoxyethylene glycol mono(meth)acrylate.

(Solvent for Solution of Compound Having Polymerizable Group)

The solvent for dissolving or dispersing the compound having a polymerizable group is not particularly limited as far as it can dissolve the compound having the polymerizable group and optional additives. The solvent is preferably a water-based solvent such as water or a water-soluble solvent. The mixture of such solvents is also preferable. The solvent may include a surfactant.

The term "water-soluble solvent" used herein refers to a solvent miscible with water in an arbitrary ratio. Examples of the water-soluble solvent include alcoholic solvents such as methanol, ethanol, propanol, ethylene glycol and glycerin, acids such as acetic acid, ketone-based solvents such as acetone, and amide solvents such as formamide.

(Application of Energy for Generating Graft Polymer)

In the invention, in order to bring the compound having a polymerizable functional group into contact with the substrate having a specific compound (Q-X-Y), the above-mentioned method is generally employed which comprises immersing the substrate in a solution including dissolved or dispersed monomers such as the hydrophilic monomer. Alternatively, coating methods may be employed which comprise coating the substrate with a layer whose principal component is a composition including the polymerable-group-containing hydrophilic monomer. When energy is applied while the compound having a polymerizable functional group and the specific compound (Q-X-Y) contact each other, a polymerization reaction initiates at the polymerization initiating group Y and the compound having a polymerizable functional group polymerizes.

There is no particular restriction on the method for applying energy to the polymerization initiation layer for the generation of a graft polymer, as far as sufficient energy for the decomposition and activation of the initiator in the polymerization initiation layer can be applied. The method may be a heat polymerization method using a thermal head, a heater, or the like, or an atom transfer radical polymerization method using a metal complex. The heat polymerization method is preferable since the cost is low and the necessary apparatuses can be compact. In an embodiment, it is desirable not to use light irradiation, and the light irradiation is not used in the embodiment. Examples of the polymerization initiating mechanism in the case of the heat polymerization method include radical generation caused by a thermal decomposition of an azo group or the like and thermal radical generation from a nitrogen oxide such as nitroxime. Examples of the polymerization initiating mechanism in the case of the electron transfer radical polymerization method include thermal radical generation from a cobalt-polifin complex and radical generation caused by a further reaction of thermally-generated radicals such as an iodine transfer polymerization or a RAFT polymerization. These methods are described in T. Hukuyama, "*KOBUNN-SHI*", Vol. 48, 498 (1999), the disclosure of which is incorporated by reference. The methods described in the reference can be appropriately used in the invention.

In order to prepare a graft polymer having functions such as the hydrophilicity and the adsorptivity to other substances, the graft polymer may be prepared from monomers including a monomer having a desired functional group. The thickness of the resultant graft layer is preferably 0.001 to 10 $g/m^2$, and more preferably 0.01 to 5 $g/m^2$.

The specific polymer used in the above-described method (2) obtained by initiating polymerization at the polymerization initiating group Y of the compound (Q-X-Y) to form a polymer chain extending from Y. The obtained polymer has the substrate binding group Q at one terminal thereof. The surface graft material is obtained by binding the substrate binding group Q to the functional group Z on the surface of the substrate.

In the following, examples of the specific polymers prepared from the compound (Q-X-Y) as a starting material are shown.

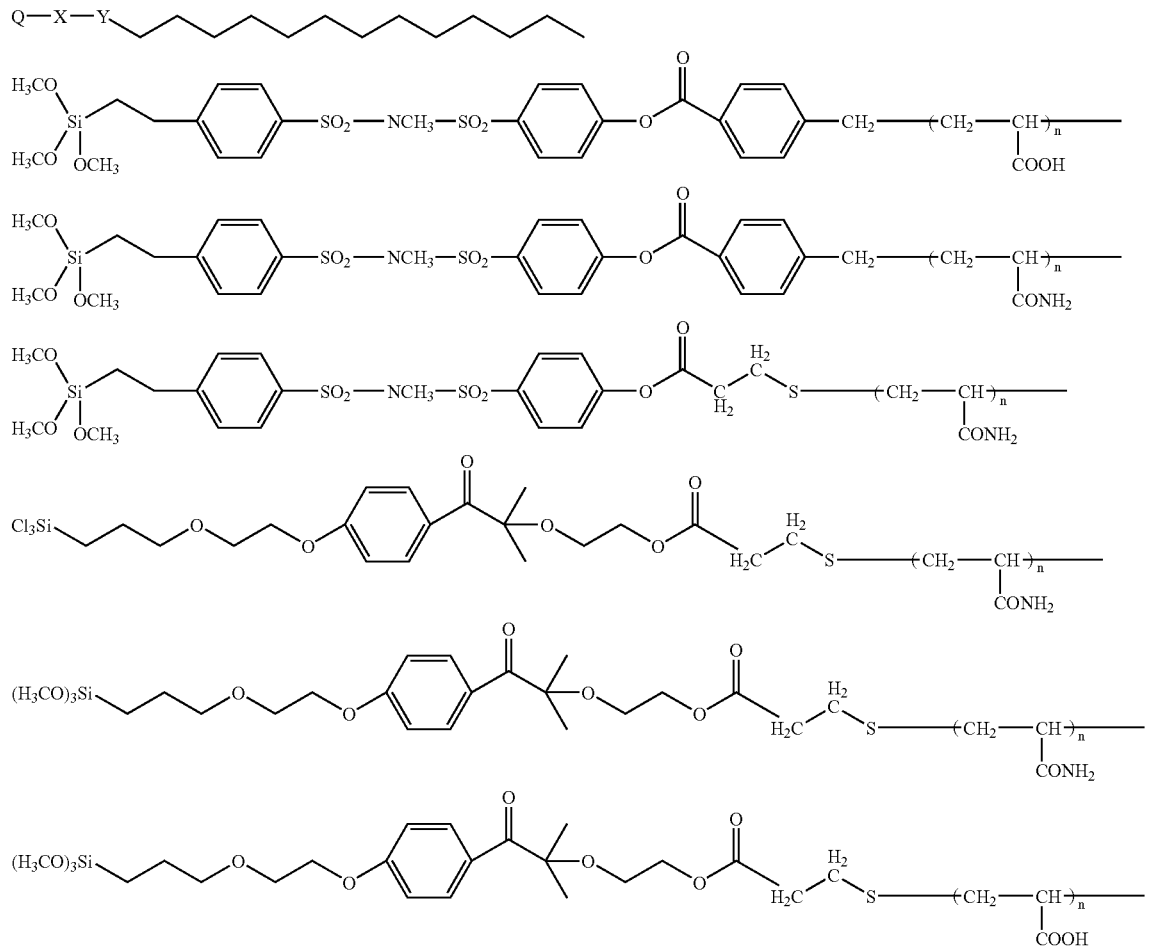

In an embodiment, the specific polymer is prepared by: synthesizing a polymer using a carboxylic acid having a thiol group at a terminal thereof as a chain transfer agent, introducing a carboxyl group into a polymer terminal, and connecting the carboxyl group to the photocleavable moiety connected to the substrate binding group. In another embodiment, the specific polymer is synthesized by causing an atom transfer polymerization which initiates at a terminal moiety of a compound, wherein in the compound, the terminal moiety such as a benzyl chloride group is linked to the photocleavable moiety which is further connected to the substrate binding group.

The method for introducing the compound (Q-X-Y) connected to the polymer into the surface of the substrate may be the chemical adsorption method and the gas phase method described above as the method for introducing the compound (Q-X-Y). The method is preferably the chemical adsorption method from the viewpoint of productivity.

The thickness of the graft layer formed by the method (2) as mentioned above is preferably 0.1 to 10 $g/m^2$, more preferably 1 to 5 $g/m^2$.

Regardless of the production method, in the obtained surface graft material of the invention, the graft polymer chains are directly bonded to the surface of the substrate through the photocleavable moiety (X). Accordingly, the graft polymer chain is firmly bonded to the surface of the substrate unless subjected to a light irradiation capable of cleaving the photocleavable single bond in the photocleavable moiety X.

The graft polymer chain has such a structure that one terminal is directly bonded to the surface of the substrate by a chemical bond and that the hydrophilic graft portion is not substantially cross-linked. Owing to the structure, the hydrophilic graft portion is not buried in a strong cross-linking structure thus is highly mobile. Therefore, the graft polymer exhibits excellent hydrophilicity compared to polymers having ordinary cross-linking structures.

The molecular weight of such a hydrophilic graft chain may be in the range of 500 to 5,000,000, preferably 1000 to 1,000,000, more preferably 2000 to 500,000.

[Substrate]

There is no particular restriction on the substrate used in the surface graft material of the invention and the substrate may be suitably selected from the following examples. In an embodiment, the substrate is a substrate having thereon a functional group that can be connected to a graft polymer chain such as a hydroxyl group, a carboxyl group or an amino group. In another embodiment, the substrate is a substrate on which such a functional group can be introduced or generated by a surface treatment such as plasma treatment.

In general, the substrate is a plate-shaped substrate such as a silicon substrate, a glass substrate, an aluminum substrate or a plastic film. However, the substrate may be in other forms and may be in arbitrary shape (for example, cylindrical shape). The graft polymer can be provided on such a substrate in an arbitrary shape.

In an embodiment, the substrate is a silicon wafer, a glass plate or a polyethylene terephthalate (PET) film, preferably a glass substrate or a silicon substrate. The thickness of the substrate is not particularly limited and may be selected in accordance with the purpose. In an embodiment, the thickness of the substrate is 1 μm to several centimeters. In an embodiment, the substrate is an organic polymer such as epoxy, acryl, polyimide, or urethane, and the substrate may be subjected to a glow treatment or a plasma treatment so as to introduce the functional group Z to the surface. In an embodiment, the substrate is composed of a base material and an intermediate layer on the substrate, wherein the intermediate layer has the functional group Z on its surface.

After the surface graft material having the graft polymer chain on its entire surface produced by any of the above methods, the surface graft material may be purified, for example by being washed with a solvent so as to remove the remaining homopolymers. In an embodiment, the surface graft material may be washed with acetone or water and dried. From a viewpoint of the removability of the homopolymers, ultrasonic washing with a solvent is preferable.

After the purification, homopolymers do not remain on the surface graft material, and the only remaining graft polymer chains are the graft polymer chains strongly bonded to the substrate.

The surface graft materials may have various characteristics if a monomer having a desired functional group or a specific polymer having a desired functional group is used in the preparation of the graft polymer. If irradiated with a light, the photocleavable moiety in the surface graft layer is cleaved; thus the bond at the root portion of the surface graft where the surface graft layer is bonded to the substrate is cut. Therefore, the surface graft layer having a predetermined function can be easily separated from the substrate by an irradiation of the entire surface with a light. When pattern exposure is conducted, only the graft polymer chains in the exposed area becomes easily removable; accordingly, the pattern-exposed surface graft material can be preferably used in a graft pattern formation method of the invention described below.

In the next place, a graft pattern formation method that uses the surface graft material of the invention will be described. When the surface graft material of the invention is pattern-exposed, as described above, a predetermined single bond in a photocleavage moiety X in the exposed area is cleaved, and the graft polymer chains in the exposed area is separated from the substrate. At this time, since there is no obstructive homopolymers in the neighborhood, graft polymers in the exposed area can be easily removed. Even in a fine image, the graft polymer in the exposed area can be removed easily. Accordingly, a graft pattern having a desired resolution can be obtained in accordance with the exposure pattern.

The resolution of the graft pattern depends on the exposure conditions. The exposure method used in the graft pattern formation method of the invention is not particularly restricted. As far as the exposure can apply a sufficient energy for cleaving the photocleavable moiety X, the light may be a UV light or a visible light. A UV light and a deep UV light are preferable light sources.

By using the graft surface material of the invention, it is possible to form a pattern with high resolution. When the pattern exposure for high-definition image recording is conducted, a high definition pattern is formed in accordance with the exposure. The exposure method for forming a high definition pattern may be a light beam scanning exposure using an optical system or an exposure with a mask. The exposure method may be suitably selected in accordance with the resolution of the desired pattern. Examples of the high definition pattern exposure include stepper exposures such as the i-line stepper, KrF stepper, and ArF stepper.

The surface graft material is washed with a solvent such as pure water or acetone after the exposure, in order to remove the free graft polymer chains caused by bond-cleavage in the exposed area. According to the method of the invention, the free graft polymer generated in the exposed area can be easily removed by a conventional washing methods such as the living water washing, dip cleaning and ultrasonic cleaning since there are no obstructive homopolymers in the neighborhood of the surface graft region.

The graft pattern formation method using the surface graft material of the invention has a broad range of application since a fine pattern can be easily formed in accordance with the exposure resolution. The area (in the patterned surface graft material) on which the graft polymer chains are formed is occasionally referred to as "graft polymer area" hereinafter. The graft polymer may have a hydrophilic group. The graft polymer having a hydrophilic group forms a hydrophilic area. The surface of the hydrophilic area is sometimes referred to as "hydrophilic surface" hereinafter.

Conductive Pattern Material (R)

In the preparation of the conductive pattern material of the invention, the surface graft material of the invention is used. The constitution specific to the conductive pattern material (R) is described in the following.

[Conductive Substance]

In the invention, a conductive pattern can be obtained and a circuit can be formed by adhering a conductive substance to the graft polymer area. The method for adhering such a conductive substance may be:

(A) a method comprising adhering conductive particles to the graft polymer area; or (B) a method comprising forming a conductive polymer layer on the graft polymer area.

The method can be appropriately selected in accordance with the application. In the following, the above methods will be described in detail.

(A) Adhering Conductive Particles

The method (A) comprises ionically adhering a conductive particle to a functional group on the graft polymer chain having an affinity for the conductive substance by utilizing the polarities thereof. The conductive substance molecule adhered to the graft polymer is strongly fixed in a state close to a monomolecular film; accordingly, only a small amount of the conductive substance gives a sufficient conductivity and the conductive pattern material can be used for forming a fine circuit.

The conductive particle usable in the method is not particularly limited as far as it is electrically conductive, and can be arbitrarily selected from particles of conventional conductive substances. Examples thereof include: metal particles of such as Au, Ag, Pt, Cu, Rh, Pd, Al and Cr; oxide semiconductor particles of such as $In_2O_3$, $SnO_2$, ZnO, CdO, $TiO_2$, $CdIn_2O_4$, $Cd_2SnO_2$, $Zn_2SnO_4$ and $In_2O_3$—ZnO; particles of substances obtained by doping the above substances with an impurity compatible with the substances; spinel compound particles of such as MgInO and CaGaO; conductive nitride particles of such as TiN, ZrN and HfN; conductive borate particles of such as $LaB$; and conductive polymer particles, which are organic substances.

—Relationship between the Polarity of Hydrophilic Group and Conductive Particle—

When the graft polymer has an anionic functional group such as a carboxyl group, a sulfonic group, or a phosphonic group, the graft polymer area in the pattern selectively has a negative charge. By adhering thereto a positively charged (cationic) conductive particle, a conductive area (wiring) can be formed.

The cationic conductive particle may be, for example, a metal (oxide) particle having a positive charge. Particles having dense positive charges on their surfaces can be prepared, for example by a method of T. Yonezawa, which is described in T. Yonezawa, *Chemistry Letters*, 1061 (1999), T. Yonezawa, *Langumuir*, vol. 16, 5218 (2000) and T. Yonezawa, *Polymer Preprints. Japan* vol. 49, 2911 (2000). Yonezawa et al. has demonstrated that a metal particle surface can be formed by using a metal-sulfur bond, the surface being densely chemically modified with functional groups having positive charges.

When the graft polymer has a cationic group such as an ammonium group described in JP-A No. 10-296895, the graft polymer area in the pattern selectively has a positive charge. A conductive area (wiring) can be formed by adhering thereto a negatively charged conductive particle. The negatively charged metal particle may be, for example, gold or silver particles obtained by reduction with citric acid.

The particle size of the conductive particle used in the invention is preferably 0.1 to 1000 nm, more preferably 1 to 100 nm. When the particle size is smaller than 0.1 nm, the conductivity tends to be low since the conductivity derives from continuous contact between surfaces of particles. When the particle size is larger than 1000 nm, the adhesion between the hydrophilic surface and the particle lowers and the strength of the conductive area is likely to be deteriorated.

These particles are preferably bound in the maximum amount adherable to the hydrophilic groups on the graft polymer from the viewpoint of durability. Furthermore, from a viewpoint of securing the conductivity, the concentration of the conductive particles in the conductive particle dispersion liquid is preferably about 0.001 to about 20% by weight.

The method for adhering the conductive particle to the functional group having an affinity such as a hydrophilic group may be, for example: a method comprising applying a liquid including a dissolved or dispersed conductive particle having an electric charge thereon to a surface of the substrate on which graft polymer chains are formed imagewise; and a method comprising immersing such a substrate in such a liquid. In both of the methods, the contact time between the liquid and the surface of the surface graft material is preferably about 10 sec to about 24 hr, and more preferably about 1 minute to about 180 minutes, in order to cause a sufficient amount of conductive particle to be bound to the hydrophilic group or the like by an ionic bond when an excessive amount of the conductive polymer is supplied.

Only a single kind of conductive particle may be used or a plurality of kinds of conductive particles may be used in accordance with the necessity. Furthermore, in order to obtain a desired conductivity, a plurality of substances may be blended to form a particle.

(B) Formation of Conductive Polymer Layer

The method (B) for adhering a conductive substance comprises allowing the functional group on the hydrophilic surface to ionically adsorb a conductive monomer, causing a polymerization of the conductive monomer to form a polymer layer (conductive polymer layer). Thus obtained conductive polymer layer is strong and excellent in durability. According to the method, it is possible to form a very thin film by controlling conditions such as the supply speed of the monomer. The resultant thin film is homogeneous and has a uniform film thickness.

The conductive polymer applicable to the method may be selected from polymer compounds with a conductivity of $10^{-6}$ s·m$^{-1}$ or higher, preferably $10^{-1}$ s·cm$^{-1}$ or higher. Examples thereof include a conductive polyaniline, polyparaphenylene, polyparaphenylene vinylene, polythiophene, polyfuran, polypyrrole, polyselenophene, polyisothianaphthene, polyphenylene sulfide, polyacetylene, polypyridyl vinylene and polyazine, each of which may be substituted. Only a single conductive polymer may be used or a plurality of conductive polymers may be used in accordance with the purpose. In an embodiment, a mixture of a conductive polymer and a nonconductive polymer is used which has such a mixing ratio that a desired conductivity is attained. In another embodiment, a copolymer of a conductive monomer and a nonconductive monomer is used which has a desired conductivity.

The method of forming a conductive polymer layer with such a conductive polymer is not particularly restricted. In order to form a uniform thin film, the following method is preferable which uses a conductive monomer.

The method comprises: immersing the substrate having the graft pattern in a solution including a polymerization catalyst such as potassium persulfate or iron sulfate (III) and a compound having a polymerization initiation capability; and gradually delivering a monomer capable of forming a conductive polymer such as 3,4-ethylene dioxythiophene by drops into the solution while stirring the solution. In this method, the functional group on the hydrophilic polymer having a polymerizable group and the monomer interact with each other and the monomer is strongly adsorbed by the functional group. The polymerization of the monomer proceeds to form a very thin film of the conductive polymer on the graft polymer area on the support. The thin film is a conductive polymer layer.

In the invention, the conductive monomer interact with the functional group in the hydrophilic area by an electrostatic force or by a polarity force and strongly adhered to the hydrophilic area. Accordingly, the resultant polymer film forms interact strongly with the hydrophilic surface. Therefore, even a thin film has a sufficient strength against scrubbing or scratching.

Furthermore, when the conductive polymer has a positive charge and the hydrophilic functional group have a negative charge, the hydrophilic functional group absorbed by the conductive polymer works as a dopant; accordingly, the conductivity of the conductive pattern can be further improved. In an embodiment, the substances of the conductive polymer and the graft polymer are selected such that the above effect can be obtained. Specifically, for instance, if the hydrophilic group is styrene sulfonic acid and the conductive polymer is derived from thiophene, then polythiophene with a sulfonic acid group (sulfo group) as a counter anion exists at the interface between the hydrophilic surface and the conductive polymer layer because of the interaction between the conductive polymer and the hydrophilic group. The counter anion functions as a dopant of the conductive polymer.

The film thickness of the conductive polymer layer formed on the hydrophilic area is not particularly limited, and is preferably 0.01 to 10 μm, more preferably 0.1 to 5 μm. When the film thickness is in the range, sufficient conductivity and transparency can be attained. When the film thickness is 0.01 μm or less, in some cases, the conductivity is insufficient.

The conductive pattern obtained by the method of the invention for forming a conductive pattern is excellent in the strength and durability. The conductive pattern is expected to be used in wide range of applications such as a high definition wiring board prepared by a single circuit formation process or a wiring board requiring a large area of conductivity region.

Furthermore, when a transparent film such as PET is used as a support, the conductive pattern can be used as a patterned transparent conductive film. The transparent conductive film may be used in a transparent electrode for a display, a light control device, a solar battery, a touch panel, and a transparent conductive film for other applications. The transparent conductive film is particularly useful as an electromagnetic wave shield filter attachable to a CRT or a plasma display. Since such an electromagnetic wave shield filter has to be highly conductive and transparent, the conductive substance is preferably disposed in lattice. The width of the lattice line is preferably 20 to 100 μm. The space between the neighboring lattice lines is preferably about 50 to about 600 μm. The lattice does not necessarily have a regular arrangement with straight lines, and may be formed with curved lattice lines.

According to the invention, a further finer pattern having a line width of 10 μm or less can be formed. Therefore, a metal wiring or metal particle adhesion region having an arbitrary pattern can be easily formed. The design of the conductive pattern is highly flexible and can be adapted to various purposes.

Conductive Pattern Material (S) and Metal Particle Pattern Material

In preparation of a conductive pattern material (S) and a metal particle pattern material of the invention, the surface graft material of the invention is used. Specific features of the conductive pattern material (S) and metal particle pattern material is described below.

The graft polymer in the conductive pattern material (S) or the metal particle pattern material has a functional group having an affinity for the metal ion or the metal salt, or has a functional group that interacts with the electroless plating catalyst or a precursor thereof. Therefore, in an embodiment, the graft polymer adsorbs a metal ion or a metal salt. The adsorption may be ionic. The adsorbed metal ion is reduced and elemental metal deposits on the area to form a metal thin layer. In another embodiment, the graft polymer adsorbs an electroless plating catalyst or a precursor thereof. Then, a metal film is formed on the area by electroless plating with the adsorbed electroless plating catalyst (precursor).

If the obtained metal (particle) layer forms a continuous layer, a conductive area can be obtained. In the area where the graft polymer chain is not present, the metal ion, metal salt and electroless-plating catalyst are not adsorbed nor impregnated; accordingly, a metal (particle) film is not formed. Consequently, when the metal thin film forms a conductive area, the area free of the graft polymer chain forms a nonconductive insulating area. These processes will be explained in more detail in the following.

[Formation of Metal (Particle) Film]

After the surface graft material is patterned, the surface graft material is subjected to a subsequent process described below. In an embodiment, a metal ion or a metal salt is adhered to the graft polymer area, then the metal ion or the metal ion in the metal salt is reduced to form a metal thin film or a metal particle adsorption region.

The method for adhering a metal ion or a metal salt can be appropriately selected, depending on the graft polymer. The following methods (1) to (4) are examples of the method.

(1) This method is applicable if the graft polymer is hydrophilic and has an ionic group. The method comprises allowing the graft polymer to adsorb a metal ion.

(2) This method is applicable if the graft polymer includes a compound having a high affinity for the metal salt such as polyvinyl pyrrolidone. The method comprising impregnating the graft polymer area with a metal salt or a solution containing a metal salt.

(3) This method comprises immersing the graft polymer area in a solution containing a metal salt so as to impregnate the graft polymer area with the solution.

(4) This method comprises conducting electroless plating on the graft polymer area by a method described below to form a metal film. In particular, the method (3) does not require the compound to have a specific character and is applicable to adhering a desired metal ion or metal salt to the graft polymer area.

<Metal Ion and Metal Salt>

In the next place, the metal ion and the metal salt will be explained.

In the invention, the metal salt is not particularly limited as long as the metal salt can be dissolved in a solvent to form a metal ion and a base (negative ion) wherein the solvent is appropriate for being applied to the surface of the hydrophilic surface. For example, the metal salt may be $M(NO_3)_n$, $MCl_n$, $M_{2/n}(SO_4)$ or $M_{3/n}(PO_4)$ (M denotes a n-valent metal atom). The metal ion may be a metal ion formed by the dissociation of any of the above metal salts. Ag, Cu, Al, Ni, Co, Fe and Pd are examples of the metal. Ag is a preferable metal for forming a conductive film. Co is a preferable metal for forming a magnetic film.

In an embodiment of the above method (1), the metal salt is dissolved in an appropriate solvent, and the solution is coated on the surface of the substrate having the graft polymer area. In another embodiment, the substrate with the graft polymer is immersed in the solution (containing the metal ion). When the solution is brought into contact with the surface of the substrate, the metal ion is ionically adsorbed by the ionic functional group. In order to allow the adsorption to occur sufficiently, the metal ion concentration or the metal salt concentration of the solution is preferably 1 to 50% by mass, more preferably 10 to 30% by mass. The contact time is preferably about 1 hr to about 24 hr.

In an embodiment of the above method (2), the metal salt in the form of a particle is directly applied to the graft polymer area. In another embodiment, a dispersion liquid is prepared with a solvent appropriate for dispersing the metal salt and (i) the dispersion liquid is coated on the surface of the substrate having the graft polymer area, or (ii) the substrate having the graft polymer area is immersed in the dispersion liquid. Since the graft polymer area in the pattern has a graft polymer, the water retention property thereof is very high. Owing to the high water retention property, the graft polymer area can be impregnated with the dispersion liquid including a dispersed metal salt. In order to sufficiently impregnate the graft polymer area with the dispersion liquid, the metal salt concentration of the dispersion liquid is preferably 1 to 50% by mass, more preferably 10 to 30% by mass. The contact time is preferably about 1 hr to about 24 hrs.

In an embodiment of the above method (3), a dispersion liquid or a solution of the metal salt is prepared by using a suitable solvent, and (i) the dispersion liquid or the solution is coated on the surface of the substrate having the graft polymer area, or (ii) the substrate having the graft polymer area is immersed in the dispersion liquid or the solution. As described above, since the graft polymer area has a high water retention property, the graft polymer area can be impregnated with the dispersion liquid or the solution. In order to sufficiently impregnate the graft polymer area with the dispersion liquid or the solution, the concentration of the metal salt in the dispersion liquid or the solution is preferably 1 to 50% by mass, more preferably 10 to 30% by mass. The contact time is preferably about 1 hr to about 24 hrs.

[Reducing Agent]

In the invention, the reducing agent for reducing the metal ion or the metal ion in the metal salt is not particularly limited as long as the reducing agent can reduce the metal ion or the metal ion in the metal salt to deposit metal. The reducing agent may be, for instance, a hypophosphite, tetrahydroborate or hydrazine.

The reducing agents can be appropriately selected in accordance with the metal salt or metal ion. If an aqueous solution of silver nitrate is applied to the graft polymer area, for example, sodium tetrahydroborate can be used as the reducing agent. If an aqueous solution of palladium dichloride is applied to the graft polymer area, hydrazine can be used as the reducing agent.

In an embodiment, after a metal ion or a metal salt is provided on the surface of the substrate having the graft polymer area, the substrate is washed with water so that free metal salt or metal ion is removed, then the substrate is immersed in water such as ion-exchanged water, then the reducing agent is added to the water. In another embodiment, an aqueous solution of the reducing agent having a predetermined concentration is directly coated or dropped on the surface of the substrate. The amount of the reducing agent to be added is preferably an excessive amount relative to the amount of the metal ion. In an embodiment, the amount of the reducing agent is equivalent to the amount of the metal ion or higher. In another embodiment, the amount of the reducing agent is 10 times the amount which is equivalent to the amount of the metal ion.

The metal (particle) film formed by the addition of the reducing agent is uniform and has high strength. The presence of the metal (particle) film can be confirmed by visual observation of the metallic luster on the surface. Its structure can be confirmed by an observation with a transmission electron microscope or an AFM (atomic force microscope). The film thickness of the metal (particle) film can be easily measured by a standard method such as a method of observing a section with an electron microscope.

[Relationship between the Polarity of the Functional Group on the Graft Polymer Chain and The Metal Ion or the Metal Salt]

In an embodiment in which the graft polymer chain has a functional group having a negative charge, a metal ion having a positive electric charge is provided on the graft polymer area and adsorbed by the functional group. In the embodiment, the adsorbed metal ion is reduced to deposit, thus a metal particle region is formed by the deposition of metal particles (when a continuous layer is formed, a conductive region may be a wiring).

[Relationship between the Polarity of the Hydrophilic Group and the Metal Ion or the Metal Salt]

When the graft polymer has an anionic functional group such as a carboxyl group, a sulfonic group, or a phosphonic group as the hydrophilic group, the graft polymer area in the pattern selectively has a negative charge. By adhering thereto a metal ion having a positive charge and reducing the metal ion, a metal (particle) film region (for example, wiring) can be formed.

When the graft polymer has a cationic group such as an ammonium group described in JP-A No. 10-296895, the graft polymer area in the pattern selectively has a positive charge. In that case, a metal (particle) film region (such as wiring) can be formed by impregnating the graft polymer area with a solution including a metal salt and reducing the metal ion in the solution.

From a viewpoint of the durability, the metal ion is adhered to the hydrophilic group on the hydrophilic surface in the maximum amount which can be adhered (adsorbed).

The method for adhering the metal ion to the ionic group may be, for example: a method comprising applying a liquid including a dissolved or dispersed metal salt or metal ion to a surface of the substrate on which graft polymer chains are formed imagewise; or a method comprising immersing such a substrate in such a liquid. In both of the methods, the contact time between the liquid and the surface of the surface graft material is preferably about 10 sec to about 24 hrs, and more preferably about 1 minute to about 80 minutes, in order to cause a sufficient amount of the metal ion or metal salt to be adhered to the graft polymer by ionic bonds when an excessive amount of the metal ion is supplied.

Only a single kind of metal ion may be used or plural kinds of metal ions may be used in accordance with the necessity. Furthermore, in order to obtain desired conductivity, a plurality of materials can be blended and used.

It is confirmed that the metal particles are dispersed densely in the graft polymer layer in the graft polymer area when the surface and section of the area are observed with a SEM or an AFM. The particle size of the metal particles is generally 1 nm to 1 μm.

The metal thin film pattern prepared by the above method can be used as a conductive pattern without any further treatment. However, in order to improve the film quality and the conductivity, heat treatment is preferably conducted as described below. If the metal particles in the metal particle pattern are densely adsorbed and seem to form a metal thin film, the metal particle pattern can be used as a conductive pattern without any further treatment. However, in order to secure an efficient conductivity, the metal particle pattern is preferably subjected to a heat treatment.

The heating temperature in the heat-treatment is preferably 100° C. or higher, more preferably 150° C. or higher, still more preferably 200° C. or higher. The heating temperature is preferably 400° C. or lower, in consideration of the treatment efficiency and the dimensional stability of the substrate. The heating time is preferably 10 min or longer, and more preferably about 30 min to about 60 min. By the heat treatment, the uniformity of a composition in the film and the uniformity of the film thickness are supposedly improved in the case of the metal film. By the heat treatment, some neighboring metal particles are partially fused to each other to improve the conductivity in the case of the metal particle adsorption region.

Furthermore, in an embodiment of the method (4) involving electroless plating, (4-1) an electroless plating catalyst or a precursor thereof is adhered to the graft polymer area, then (4-2) electroless plating is conducted to form a metal film in pattern. The embodiment will be explained in sequential order.

[(4-1) Adhering an Electroless Plating Catalyst or a Precursor Thereof to a Graft Pattern]

<Electroless Plating Catalyst>

The electroless plating catalyst is generally a 0-valent metal such as Pd, Ag, Cu, Ni, Al, Fe or Co. In the invention, Pd and Ag are preferable because of their handling easiness and high catalytic power. The method for fixing the 0-valent metal onto the graft pattern (interacting region) may be, for instance, a method comprising providing the graft polymer area with a metal colloid (electroless plating catalyst) having such an electric charge as to interact with the functional group (interacting group) on the graft pattern. In general, the metal colloid can be prepared by reducing metal ion in a solution including a charged surfactant or a charged protective agent. The electric charge of the metal colloid can be controlled by the kind of surfactant or the kind of protective agent. The metal colloid provided onto the graft polymer area is selectively adsorbed by the graft polymer area.

<Electroless Plating Catalyst Precursor>

The electroless plating catalyst precursor is not particularly limited as long as the precursor becomes an electroless plating catalyst by a chemical reaction. Generally, the precursor is a metal ion of any of the 0-valent metals mentioned as the electroless plating catalyst. The metal ion, which is a precursor, is reduced to become a 0-valent metal, which is an electroless plating catalyst. The metal ion adhered to the graft polymer area may be reduced to become a 0-valent metal before immersed in an electroless plating bath, or may be immersed in an electroless plating bath so as to be converted to a metal (electroless plating catalyst) by a reducing agent in the bath.

In an embodiment, the metal ion is provided onto the graft polymer area in the state of a metal salt. The metal salt is not particularly limited as long as the metal salt can be dissolved in an appropriate solvent to dissociate into a metal ion and a base (negative ion). The metal salt may be $M(NO_3)_n$, $MCl_n$, $M_{2/n}(SO_4)$ or $M_{3/n}(PO_4)$ (M denotes a n-valent metal atom). The metal ion may be an ion generated by a dissociation of any of the above metal salts. Examples thereof include Ag ion, Cu ion, Al ion, Ni ion, Co ion, Fe ion and Pd ion. Ag ion and Pd ion have high catalytic power.

The method for providing the metal colloid or the metal salt onto the graft pattern, may be a method comprising: dispersing the metal colloid in a proper dispersion medium or dissolving the metal salt in a proper solvent to prepare a solution including dissociated metal ion; and coating the graft polymer area with any of the solution or the dispersion liquid, or immersing the substrate having the graft pattern in the solution or the dispersion liquid. The metal ion can be adsorbed to the interacting groups in the graft polymer area by an ion-ion interaction or a dipole-ion interaction, or the graft polymer area can be impregnated with the metal ion. In order to sufficiently carry out the adsorption or impregnation, the metal ion concentration or metal salt concentration of the solution to be provided onto the area is preferably 1 to 50% by mass, more preferably 10 to 30% by mass. The contact time is preferably about 1 min to about 24 hrs, more preferably about 5 min to about 1 hr.

[(4-2) Conducting Electroless Plating to Form a Metal Film in Pattern]

The electroless plating is applied to the substrate obtained by (4-1), so that a metal film is formed in pattern. When the electroless plating is applied as described below, a dense metal film is formed on the graft pattern in accordance with the graft pattern. As a result, the resultant metal pattern has an excellent conductivity and adhesiveness.

<Electroless Plating>

The electroless plating means an operation comprising allowing a metal to deposit through a chemical reaction by using a solution in which an ion of the metal is dissolved. In an embodiment, the substrate having the electroless plating catalyst in pattern obtained by (4-1) is washed with water to remove free electroless plating catalyst (metal), then the substrate is immersed in an electroless plating bath. The electroless plating bath used in the embodiment may be a generally known electroless plating bath.

In another embodiment, the substrate having the electroless plating catalyst precursor in pattern is washed with water to remove free electroless plating catalyst precursor (such as metal salt), then immersed in an electroless plating bath. In the embodiment, in the electroless plating bath, the precursor is reduced then electroless plating proceeds. The electroless plating bath used in the embodiment may be a generally known electroless plating bath.

A general electroless plating bath include (1) a metal ion for plating, (2) a reducing agent, and (3) an additive (stabilizing agent) that improves the stability of the metal ion. In the plating bath, known additives such as a stabilizing agent for the plating bath may be further included.

The metal used in the electroless plating bath may be, for example, copper, tin, lead, nickel, gold, palladium or rhodium. From the viewpoint of the conductivity, copper and gold are preferable.

The most suitable reducing agent and additives depend on the metal type. For instance, a copper electroless plating bath may include $Cu(SO_4)_2$ as a copper salt, HCOH as a reducing agent, and a chelate agent such as EDTA or Rochelle salt which stabilizes copper ion as an additive. A CoNiP plating bath may include cobalt sulfate and nickel sulfate as metal salts, sodium hypophosphite as a reducing agent, and sodium malonate, sodium malate and sodium succinate as complexing agents. A palladium electroless plating bath may include $(Pd(NH_3)_4)Cl_2$ as a metal ion, $NH_3$ and $H_2NNH_2$ as reducing agents and EDTA as a stabilizing agent. These plating baths may further include other ingredients.

The film thickness of the metal film formed as described above can be controlled by factors such as the concentration of the metal salt or metal ion in the plating bath, the immersing time in the plating bath and the temperature of the plating bath. From the viewpoint of the conductivity, the film thickness is preferably 0.5 μm or larger, more preferably 3 μm or larger. The immersing time in the plating bath is preferably about 1 min to about 3 hr, more preferably about 1 min to about 1 hr.

It is confirmed by a sectional observation with SEM that particles of the electroless plating catalyst and the plating metal are densely dispersed in the graft polymer layer and relatively large particles are present thereon. The interface is in a hybrid-state of the graft polymer and the particles; accordingly, the adhesiveness is excellent even when difference in level between the interface of the substrate (may be an organic substrate) and the interface of the inorganic substance (electroless plating catalyst or plating metal) is 100 nm or less.

[Electroplating]

In the conductive pattern formation method utilizing the electroless plating, after a metal film is formed by electroless plating (by method (4)), an additional electroplating can be conducted using the obtained metal film as an electrode. Therefore, the metal film pattern having excellent adhesiveness to the substrate can be used as a base for the additional electroplating, and another metal film having an arbitrary thickness can be easily formed thereon. When the additional electroplating is conducted, a metal film pattern having a thickness which is suitable for the application can be obtained; accordingly, the metal pattern according to the invention can be applied to various applications such as a wiring pattern.

The method for the electroplating may be a known method. The metal used in the electroplating may be copper, chrome, lead, nickel, gold, silver, tin or zinc. From the viewpoint of the conductivity, copper, gold and silver are preferable and copper is more preferable.

The film thickness of the metal film obtained by the electroplating may be controlled in accordance with the application. The film thickness can be controlled by controlling factors such as the metal concentration in the plating bath, the immersing time, or the current density. The film thickness used in a general electric wiring or the like is, from a viewpoint of the conductivity, preferably 0.3 μm or larger, more preferably 3 μm or larger.

The conductive pattern material (S) and metal particle pattern material of the invention formed by the above methods may have, on a surface thereof, a high-definition durable dense metal (particle) pattern. Such a pattern material can by prepared by simple processes of the method of the invention. The conductive pattern material and metal particle pattern of the invention can be expected to be used in a wide range of applications such as high density magnetic discs, magnetic heads, magnetic tapes, magnetic sheets and magnetic discs. The pattern materials can be used also in various circuit formation applications. Since a fine conductive region can be formed by suitably selecting the pattern formation device, the pattern materials are expected to be used for wide applications including circuit formations of such as micro-machines and VLSIs.

Furthermore, if a transparent film such as PET is used as the support, the pattern material can be used as a patterned transparent conductive film. Examples of the application of such transparent conductive film include transparent electrodes for displays, light control devices, solar batteries, touch panels, and other transparent conductive films. The transparent conductive film is particularly useful as electromagnetic wave shield filters to be attached to CRTs or plasma displays. Since such an electromagnetic wave shield filter has to be highly conductive and transparent, the metal (particle) film is preferably disposed in lattice. The width of the lattice line is preferably 20 to 100 μm. The space between the neighboring lattice lines is preferably about 50 to about 600 μm. The lattice does not necessarily have a regular arrangement with straight lines, but may be formed with curved lattice lines.

According to the invention, a further finer pattern having a line width of 10 μm or less can be formed. Therefore, a metal wiring or metal particle adhesion region having an arbitrary pattern can be easily formed. The design of the conductive pattern is highly flexible and can be adapted to various purposes.

EXAMPLES

In the following, the present invention will be described in detail with reference to examples. However, the examples should not be construed as limiting the invention.

Synthesis Example 1

Synthesis of Photocleavable Silane-Coupling Compound 1

The synthesis of the exemplary compound 1 shown above as an example of the compound (Q-X-Y) is conducted through the following four steps. Schemes of the respective steps will be explained.

1. Synthesis of ATRP Initiator [1] (Introduction of Olefin by an Etherization (Williamson Reaction))

Into a nitrogen-substituted 1000 ml three-neck flask, 22.4 g (0.1 mol) of 4-hydroxy-4'-hydroxyethoxy)-2-methylpropiophenone and 300 g of tetrahydrofuran (THF) were poured followed by cooling with an ice bath under stirring. Thereto, 9.7 g (0.24 mol) of NaH (60 to 72% in oil) was gradually added and the ice bath was removed at the completion of the addition, and the liquid was stirred for 2 hrs. The liquid was cooled again with the ice bath, and a half of a solution obtained by dissolving 13.3 g (0.11 mol) of allyl bromide in a mixture of 25 g of THF and 25 g of dimethyl acetamide (DMAc) was gradually dropped. The remaining half was dropped in 30 min. The liquid was stirred until 30 min after the dropping, then the ice bath was removed, and 100 g of DMAc was added three-times in total of 300 g (1.5 hrs, 2.5 hrs and 4 hrs after the removal of the ice bath). 3 hrs after the final addition of DMAc, the stirring was stopped and the liquid was left overnight. A small amount of methanol was added to the liquid, so that unreacted NaH was decomposed. The liquid was gradually added to 1500 ml of water. The organic phase in the solution was extracted with ethyl acetate and washed with an aqueous solution of sodium chloride. The solvent was distilled off and 27 g of yellow oil containing a product 1a was obtained.

The synthesis scheme is shown below.

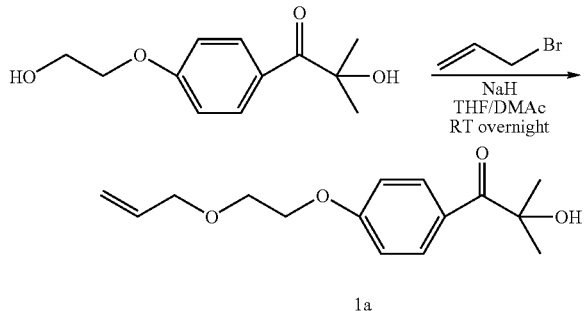

$^1$H NMR (300 MHz CDCl$_3$) δ=1.64 (s, 6H, —CH$_3$ k-CH$_3$ 1), 3.8 (t, J=4.5-5.1, 2H, —CH$_2$e), 4.1 (d, J=5.7, 2H, —CH$_2$d), 4.2 (t, J=4.2-5.4, 2H, —CH$_2$f), 4.3 (s, 2H, —OHm), 5.2 (dd, JHbHc=10.2-10.7, JHaHb=0.9-1.2, 1H, Hb), 5.3 (dd, JHaHc=17-22, JHaHb=0.9-1.2, 1H, Ha), 5.9 (ddd, JHaHc=22-17, JHbHc=10.2-10.7, JHcHd=5.4-5.7, 1H, Hc), 7.0 (dd, JHhHi=7, JHgHj=7, JHgHh=2, JHiHj=2, 2H, Hg, Hi), 8.1 (dd, JHhHi=7, JHgHj=7, JHgHh=2, JHiHj=2, 2H, Hh, Hj)

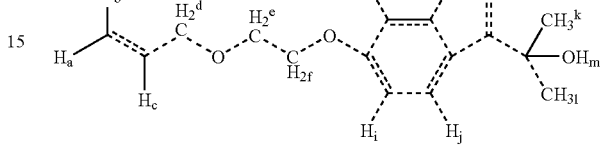

2. Synthesis of 1b (Introduction of a Long Chain Alcohol Using a Protective Group)

Firstly, into a 200 ml egg-shaped flask, 14.4 g (0.069 mol) of 8-bromo-1-octanol and 10 g of THF were poured, then 7.3 g (0.087 mol) of 3,4-dihydro-2H-pyran was dropped under stirring. A solution A was obtained after 30 min stirring.

In the next place, into a 300 ml three-neck flask, 14.5 g (0.055 mol) of the yellow oil containing the product 1a and 100 g of DMAc were poured and stirred under cooling with an ice bath. Thereto, 3.3 g (0.083 mol) of NaH (60 to 72% in oil) was gradually added followed by stirring for 30 min. The solution A was dropped thereto, the ice bath was replaced with a water bath, and the liquid was maintained at 50° C. for 1.5 hr. A small amount of methanol was added to the liquid, then the liquid was gradually poured into 300 ml of ice water. The organic phase was extracted with ethyl acetate and washed with an aqueous solution of sodium chloride. The solvent was distilled off, thereby yellow oil was obtained. The yellow oil was dissolved in 200 ml of methanol and a small amount of p-toluene sulfonic acid is added to the solution and the solution was maintained at 70° C. for 1 hr. Water was added to the solution and the organic phase was extracted with ethyl acetate. The solvent was distilled off and thereby 35.1 g of brown oil containing a product 1b was obtained.

The synthesis scheme is shown below.

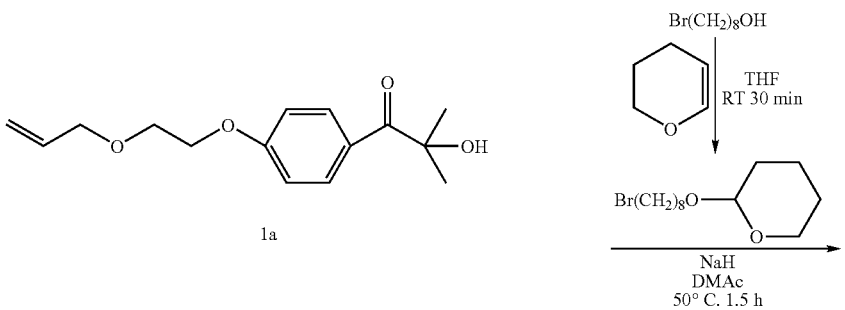

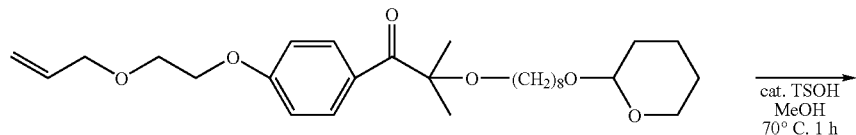

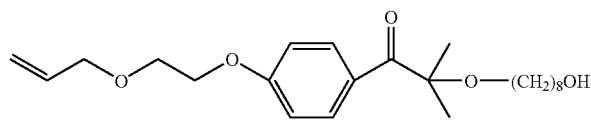

1b

3. Synthesis of 1 c (Introduction End Halogen due to Esterification Reaction)

Into a 1000 ml three-neck flask equipped with a calcium chloride tube, 25.52 g (0.065 mol) of the brown oil containing the product 1b, 200 g of THF and 6.17 g (0.078 mol) of pyridine were poured and the liquid was stirred. The liquid was cooled with an ice bath, and 14.94 g (0.065 mol) of bromoisobutylic acid bromide was gradually added to the liquid and the liquid was stirred for 15 min. The temperature of the liquid was elevated to room temperature and the liquid was stirred for 1.5 hrs. The liquid was poured into 300 ml of water. The organic phase was extracted with ethyl acetate, and washed with an aqueous solution of sodium chloride. The solvent was distilled off and thereby 43.9 g of brown oil containing a product AM2543c was obtained. By using a column (filler: WAKO-GEL C-200, developing solvent: ethyl acetate/hexane=1/5), the product 1c was isolated.

The synthesis scheme is shown below.

$^1$H NMR (300 MHz CDCl$_3$) δ=1.2-1.4 (mb, 8H), 1.5 (s, 6H), 1.7 (t, J=6.9-7.5, 4H), 1.9 (s, 6H), 3.2 (t, j=6.0-6.9, 2H), 3.8 (t, J=4.8, 2H), 4.1-4.2 (m, 6H), 5.2 (dd, J=1.8, J=10.2-11.4, 1H.), 5.3 (dd, J=1.8, J=17.1-22.5, 1H.), 5.9-6.0 (ddd, J=5.4-5.7, J=10.2-11.4, J=17.1-22.5, 2H), 6.9 (d, J=9.0, 2H), 8.3 (d, J=9.0, 2H)

4. Synthesis of a Target Product 1 (Hydrosilylation Reaction)

Into a 50 ml three-neck flask equipped with a calcium chloride tube, 4.5 g (8.31×10$^{-3}$ mol) of the product 1c was poured, then one drop of Speir catalyst (H$_2$PtCl$_4$·6H$_2$O/2-PrOH 0.1 M) was added, then the liquid was stirred. The liquid was cooled with an ice bath, then 2.4 g (17.46×10$^{-3}$ mol) of trichlorosilane (98%) was dropped into the liquid. After the dropping, the temperature of the liquid was returned to room temperature. 1 hr after the temperature elevation, the reaction came to completion. The liquid was

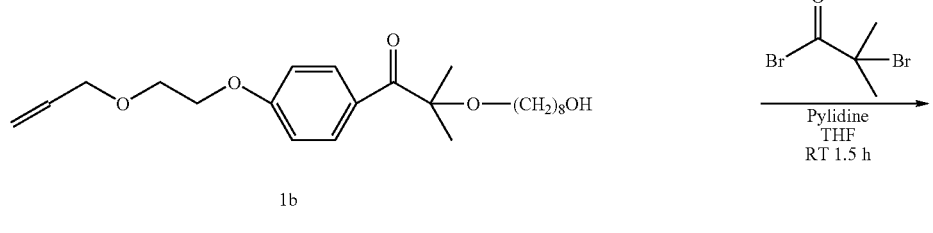

1b

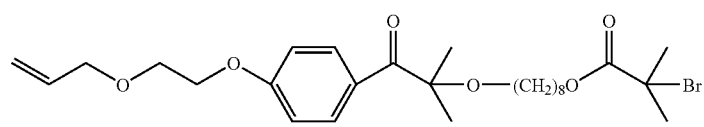

1c heated to 100° C. under a reduced pressure, and excessive trichlorosilane was removed. Thereby, a target product 1 was obtained.

The synthesis scheme is shown below.

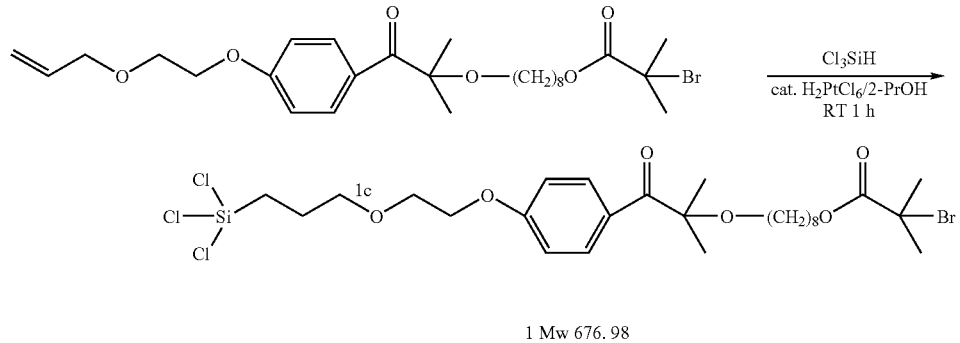

1 Mw 676.98

$^1$H NMR (300 MHz CDCl$_3$) δ=1.2-1.4 (mb, 20H), 1.5 (s, 6H), 1.9 (s, 6H), 3.2 (t, J=6.9, 2H), 3.6 (t, J=6.9, 2H), 4.2 (m, 4H), 6.9 (d, J=9.3, 2H), 8.3 (d, J=9.3, 2H)

Example 1

(Preparation of Graft Substrate A-1 (Acrylic Acid Graft))

A silicon substrate was washed with Piranha solution ((30% by weight) H$_2$SO$_4$/H$_2$O$_2$=1/1 (v/v) mixture). Then, the substrate was immersed in a 1% by mass dehydrated toluene solution of a silane coupling agent having an initiator (the exemplary compound 1 obtained in the synthesis example 1) under argon atmosphere overnight to fix the initiator onto the silicon substrate. Then, the substrate with the initiator was placed in a separable flask, immersed under argon current in an aqueous solution of sodium acrylate including copper chloride (I) and 2, 2'-bipyridyl as catalysts, then the solution was stirred, then the flask was left overnight. In this way, a graft substrate A-1 was obtained. The film thickness was measured by elipsometry and found to be 100 nm.

(Preparation of Graft Pattern A-1 (Acrylic Acid Graft Pattern))

The graft silicon substrate A-1 was brought into close contact with a mask pattern (trade mark: NC-1 manufactured by Toppan Printing Co., Ltd.) formed on a quartz plate, then irradiated with a UV light from a UV exposure machine (trade mark: UVL4001 high-pressure mercury lamp manufactured by Ushio Inc.) for 20 min, then washed with pure water. The graft pattern A-1 was formed in this way.

(Confirmation of Pattern)

The graft pattern A-1 was observed with an atomic force microscope AFM (trade name: NANOPICS 1000 manufactured by Seiko Instruments Inc., with a DFM cantilever). As a result, it was confirmed that in the pattern A-1, lines with a line width of 5 μm were formed.

Example 2

(Preparation of Graft Substrate A-2 (Methyl Methacrylate)

An initiator was fixed onto a silicon substrate in the same manner as the preparation of the graft substrate A-1 in the example 1. Then, the substrate having the initiator was placed in a separable flask. Diphenyl ether containing copper bromide (I) (0.01 M) and 4,4'-dis-neptyl-2,2'-bipyridine (0.02 mol), p-toluenesulfonyl chloride (0.0024 mol) and MMA (methyl methacrylate, 4.7M) were added into the flask. In the flask, the substrate was immersed in the above liquid and allowed to react at 90° C. for 10 hrs. Thereafter, the substrate was taken out and thoroughly washed with chloroform. The film thickness was measured by elipsometry and found to be 80 nm.

(Preparation of Pattern A-2 (Methyl Methacrylate Graft Pattern))

The graft silicon substrate A-2 was brought into close contact with a mask pattern (trade mark: NC-1 manufactured by Toppan Printing Co., Ltd.) formed on a quartz plate, and irradiated with a UV light from a UV exposure machine (trade mark: UVL4001-N high-pressure mercury lamp manufactured by Ushio Inc.) for 20 min, then washed with acetone. A graft pattern A-2 was obtained in this way.

(Confirmation of Pattern)

The obtained graft pattern A-2 was observed with an AFM as in the example 1. As a result, it was confirmed that, in the pattern A-2, lines having a line width of 8 μm were formed.

The pattern A-2 was immersed in a 0.1% by weight aqueous solution of methylene blue for 5 min, then washed with pure water. By an observation with an optical microscope, it was confirmed that a colored pattern having a line width of 8 μm was formed.

From the above examples, it was found that a fine graft polymer pattern with a resolution of 10 μm or shorter can be easily formed by using the surface graft material of the invention.

Example 3

<Preparation of Ag Particle Dispersion Liquid>

To a 50 ml ethanol solution of silver perchlorate (5 mM), 3 g of bis(1,1-trimethylammoniumdecanoylaminoethyl)disulfide was added. A 30 ml solution of sodium boronhydride (0.4 M) was gradually dropped into the above liquid under rigorous stirring. The silver ion was reduced and a dispersion liquid of silver particles covered with quaternary ammonium was obtained. The average particle size of the silver particles was found to be 5 nm by a measurement with an electron microscope.

(Adhesion of Conductive Substance)

The graft pattern A-1 of the example 1 was immersed in the silver ion dispersion liquid, and the surface of the graft pattern was thoroughly washed with living water to remove superfluous particle dispersion liquid. In this way, a conductive pattern 1 was obtained in which Ag particles adhered only to the graft polymer area.

Surfaces of the conductive patterns 1 having conductive particles were observed with a transmission electron microscope (trade name: JEM-200CM manufactured by JEOL) at a magnification of 100,000 times. By the observation, it was confirmed that in all surfaces, fine protrusions were formed which were formed by Ag particles adhered only to the graft polymer area. It was further confirmed that the conductive pattern comprised a fine wiring having a line width of 8 μm and a gap width of 8 μm.

[Evaluation of Conductivity Stability]

The surface conductivity of the Ag particle adhesion region was measured by a four probe method with LORESTA-FP (manufactured by Mitsubishi Chemical Co., Ltd.) and found to be 10 Ω/sq. The transmittance of the entire surface of the patterned film was measured and found to be 58%. From these results, it was found that a conductive pattern having high transparency and excellent conductivity was formed.

[Evaluation of Wear Resistance]

The surface of the conductive pattern 1 was manually rubbed 30 reciprocating strokes with cloth moistened with water (trade name: BEMCOT manufactured by Asahi Chemical Industry Co., Ltd.). After the scraping, the surface was observed again with a transmission electron microscope (trade name: JEM-200CX manufactured by JEOL) at a magnification of 100,000 times and it was confirmed that, similarly to the surface before the scraping, dense protrusions formed by the particles were observed only in the non-exposed area. Therefore, it was confirmed that the dense protrusions on the surface were not damaged by the scraping.

Example 4

The graft pattern A-1 of the example 1 was immersed in a solution obtained by mixing 1.23 g of sodium anthraquinone-2-sulfonate monohydrate, 7.20 g of sodium 5-sulfosalicylate hydrate and 4.38 g of iron trichloride hexahydrate and 125 ml of water. While stirring the solution, 0.75 ml of pyrrole and 125 ml of water were added to the solution. 1 hr later, the graft pattern A-1 was taken out, washed with water, then washed with acetone. A conductive material was obtained in this way which has a polypyrrole layer on the surface. The surface of the conductive pattern 2 was observed in a similar manner to the example 1 with a transmission electron microscope and it was confirmed that the conductive pattern 2 comprised a fine wiring having a line width of 8 μm and a gap width of 8 μm.

[Evaluation]

The conductivity stability and the wear resistance of the obtained conductive pattern 2 was evaluated in a similar manner to the example 3. In the evaluation of the conductivity stability, the surface conductivity of the conductive polymer layer was found to be 100 Ω/sq. Therefore, it was confirmed that the conductive pattern 2 has an excellent conductivity.

The evaluation of the wear resistance showed that the polymer layer was not damaged owing to the scraping. Even after the scraping, a resin film supposedly including the conductive polymer was observed only in the non-exposed area and peeling did not occur.

By these examples, it was confirmed that conductive patterns can be easily obtained which have an excellent conductivity and wear resistance, in both cases of conductive particles and conductive polymers as the conductive substances.

Example 5

(Preparation of Metal (Particle) Film)

The graft pattern A-1 obtained in the example 1 was immersed in a 15% by mass aqueous solution of silver nitrate (manufactured by Wako Pure Chemical Industries, Ltd.) for 12 hrs and washed with distilled water. Thereafter, the pattern A-1 was immersed in 100 ml of distilled water, and 30 ml of an aqueous solution of 0.2 M sodium tetrahydroborate was dropped into the distilled water, so that the adsorbed silver ion was reduced. By the reduction, a uniform Ag metal film (metal (particle) film) was formed on the surface of the graft polymer area in the pattern A-1. The thickness of the Ag metal film was 0.1 μm. In this way, a metal (particle) film pattern material D-1 having a Ag (particle) film was obtained.

[Evaluation of the Conductivity]

The surface conductivity of the obtained Ag (particle) film was measured by the four probe method with LORESTA-FP (manufactured by Mitsubishi Chemical Co., Ltd.) and found to be 100 Ω/sq.

[Evaluation of Metal Thin Film]

1. Film Strength (Adhesiveness)

The film adhesiveness of the metal (particle) film pattern material D-1 having a Ag (particle) film was evaluated by a cross-cut tape method in accordance with JIS (Japanese Industrial Standards) 5400 (which is incorporated herein by reference). When the peeling test of peeling a tape from cross-cut grids was conducted, no grid was peeled; that is, the adhesiveness to the substrate was found to be excellent.

2. Durability

The surface of the metal (particle) film pattern material D-1 having the silver (particle) film was manually rubbed 30 reciprocating strokes with cloth moistened with water (trade name: BEMCOT manufactured by Asahi Chemical Industry Co., Ltd.). After the scraping, the surface was visually observed. No peeling of the metal (particle) film was observed. The adhesiveness of the sample after the scraping was evaluated by the cross-cut tape method as described above, and no grid peeling was observed. That is, the adhesiveness of the metal (particle) film to the substrate did not deteriorate even after the scraping. Accordingly, it was confirmed that the durability was excellent.

Example 6

(Formation of Metal Pattern)

The graft pattern A-1 prepared in the example 1 was immersed in a 0.1% by mass aqueous solution of palladium nitrate (manufactured by Wako Pure Chemical Industries Ltd.) for 1 hr, then washed with distilled water. Thereafter, the graft pattern A-1 was immersed in an electroless plating bath having the following composition for 20 min, thereby a metal pattern D-2 was prepared.

<Composition of electroless plating bath>

| | |
|---|---|
| OPC copper H T1 (manufactured by Okuno Chemical Industries Co., Ltd.) | 6 ml |
| OPC copper H T2 (manufactured by Okuno Chemical Industries Co., Ltd.) | 1.2 ml |
| OPC copper H T3 (manufactured by Okuno Chemical Industries Co., Ltd.) | 10 ml |
| Water | 83 ml |

The surface of the metal pattern D-2 was observed with an optical microscope (Trade mark: OPTI PHOTO-2, manufactured by Nikon Corp.) and an excellent pattern was observed in which lines having a width of 8 µm alternate with gaps having a width of 8 µm.

[Evaluation of Conductivity]

The surface conductivity of the obtained Cu plating film was measured in the same manner as in example 5 and found to be 50 Ω/sq.

[Evaluation of Metal Film]

1. Film Strength (Adhesiveness)

The film adhesiveness of the metal film pattern material D-2 having a Cu film was evaluated in the same manner as described above. When the peeling test of peeling a tape from crosscut grids was conducted, no grid was peeled; that is, the adhesiveness to the substrate was found to be excellent.

According to the invention, a surface graft material useful as a pattern formation material is provided which can form a high definition polymer pattern by an exposure which does not require a specific environment such as an exhaust device. Furthermore, a graft pattern formation method using the surface graft material is provided which can easily form a high definition graft polymer pattern by an exposure.

According to the invention, a high definition conductive pattern is provided which has excellent productivity, durability and stability of conductivity. Also, a conductive pattern formation method is provided which can produce a high definition conductive pattern with excellent durability and stability of conductivity through a simple process with excellent productivity. Accordingly, the conductive pattern of the invention can be applied to wide applications such as materials that require formation of a pattern having high conductivity and arbitrary degree of definition. Examples of the application include a metal wiring material and an electromagnetic wave shield, for instance, applications to circuit formations including formation of circuit of micromachines and VLSIs, electromagnetic wave shield filters to be attached to CRTs and plasma displays, and transparent conductive films for transparent electrodes for displays, light control devices, solar batteries, touch panels and the like.

According to the invention, a thin film is provided which has a metal particle adsorption layer. In the metal particle adsorption layer, a metal particle dispersion layer densely including metal particles and having excellent adhesiveness and durability is formed in a desired pattern. The pattern can be fine and can have high resolution. Further, a metal particle pattern formation method is provided which enables production of a metal particle pattern having the above characteristics through a simple process having high productivity.

The conductive pattern of the invention can have a high definition pattern and has high conductivity. The metal particle pattern material can include a metal particle dispersion layer in which metal particles are densely dispersed and which has excellent durability in a desired fine pattern. Accordingly, these pattern materials may be used in various applications such as materials which have to have high conductivity and arbitrary pattern formability. Examples thereof include metal wiring materials and electromagnetic wave shields. For example, the pattern materials can be used in applications such as: circuit formations including circuit formations of micromachines and VLSIs; electromagnetic wave shield filters to be attached to CRTs and plasma displays; transparent conductive films for transparent electrodes for displays; light control devices, solar batteries, touch panels and other transparent conductive films; and magnetic materials such as high-density magnetic discs, magnetic heads, magnetic tapes, magnetic sheets, magnetic discs and the like.

What is claimed is:

1. A surface graft material including a substrate and a surface graft polymer chain, wherein the surface graft polymer chain includes a polymer chain, a photocleavable moiety and a substrate-bonding group in this order, and the surface graft polymer chain is directly bonded to a surface of the substrate by a covalent bond between the substrate-bonding group and the substrate.

2. The surface graft material according to claim 1, wherein the surface graft polymer chain has a hydrophilic group.

3. The surface graft material according to claim 1, wherein the surface graft polymer chain has a molecular weight of 500 to 5,000,000.

4. A graft pattern formation method comprising:
exposing a surface graft material including a substrate and a surface graft polymer which includes a polymer chain, a photocleavable moiety and a substrate-bonding group in this order, so as to cleave the photocleavable moiety in exposed areas; and
removing the surface graft polymer chain from the exposed areas to form a surface graft polymer chain pattern,
wherein the substrate-bonding group is covalently bonded to the substrate and the surface graft polymer chain pattern is formed by regions having the graft polymer chain and regions not having the graft polymer chain.

5. A conductive pattern obtained by:
exposing the surface graft material of claim 1 to cleave the photocleavable moiety in exposed areas;
removing the graft polymer chain from the exposed areas to form a graft polymer chain pattern formed by regions having the graft polymer chain and regions not having the graft polymer chain; and
adhering a conductive substance to the regions having the graft polymer chain.

6. The conductive pattern according to claim 5, wherein the surface graft polymer has a hydrophilic group.

7. The conductive pattern according to claim 5, wherein the conductive substance is a conductive particle having a particle size of 0.1 nm to 1,000 nm.

8. The conductive pattern according to claim 5, wherein the conductive substance is a conductive polymer.

9. A conductive pattern formation method comprising:
forming a graft pattern by the method of claim 4; and
adhering a conductive substance to the region having the graft polymer chain.

10. A conductive pattern material obtained by:
exposing the surface graft material of claim 1 to cleave the photocleavable moiety in exposed areas;

removing the graft polymer chain from the exposed areas to form a graft polymer chain pattern formed by regions having the graft polymer chain and regions not having the graft polymer chain;
adhering a metal salt or a metal ion to the regions having the graft polymer chain; and
reducing the metal ion or a metal ion in the metal salt to form a metal thin film.

11. The conductive pattern material according to claim 10, wherein the surface graft polymer chain has a group having an affinity for the metal ion or the metal salt.

12. A conductive pattern formation method comprising:
forming a graft pattern by the method of claim 4;
adhering a metal ion or a metal salt to the regions having the graft polymer chain; and
reducing the metal ion or a metal ion in the metal salt to form a metal thin film.

13. The conductive pattern formation method according to claim 12, further comprising heating the substrate having the metal thin film at a temperature of 100 to 400° C. after the formation of the metal thin film.

14. The conductive pattern formation method according to claim 13, wherein heating time is at least 10 minutes.

15. A metal particle pattern material obtained by:
forming a graft pattern by the method of claim 4;
adhering a metal ion or a metal salt to the regions having the graft polymer chain; and
reducing the metal ion or a metal ion in the metal salt and depositing metal particles to form a metal particle adsorption area.

16. A metal particle pattern formation method comprising:
forming a graft pattern by the method of claim 4;
adhering a metal ion or a metal salt to the regions having the graft polymer chain; and
reducing the metal ion or a metal ion in the metal salt and depositing metal particles to form a metal particle adsorption area.

17. The metal particle pattern formation method according to claim 16, further comprising heating the substrate having the metal particle adsorption area at a temperature of 100 to 400° C. after the formation of the metal particle adsorption area.

18. A conductive pattern formation method comprising:
exposing a surface graft material including a substrate and a surface graft polymer chain, which includes a polymer chain, a photocleavable moiety and a substrate-bonding group in this order, so as to cleave the photocleavable moiety in exposed areas;
removing the surface graft polymer chain from the exposed areas to form a surface graft polymer chain pattern formed by regions having the graft polymer chain and regions not having the graft polymer chain; and
providing an electroless plating catalyst or a precursor thereof onto the regions having the graft polymer chain; and
conducting electroless plating to form a metal thin film, wherein the substrate-bonding group is covalently bonded to the substrate, and the surface graft polymer chain further has a functional group which can interact with the electroless plating catalyst or the precursor thereof.

19. A conductive pattern material obtained by the method of claim 18.

20. The surface graft material according to claim 1, wherein the photocleavable moiety is any of the following photocleavable moieties 1-10:

1.
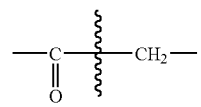

2.
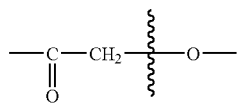

3.
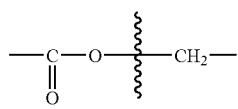

4.
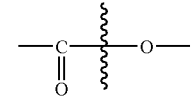

5.
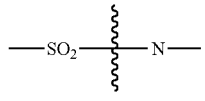

6.
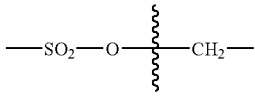

7.
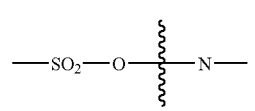

8.
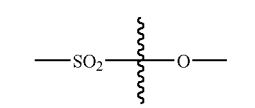

9.
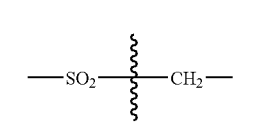

10.
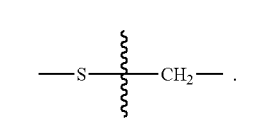

21. The surface graft material according to claim 1, wherein the surface graft polymer includes any of the following structures 1-10 having the substrate-bonding group and the photocleavable moiety:

1.
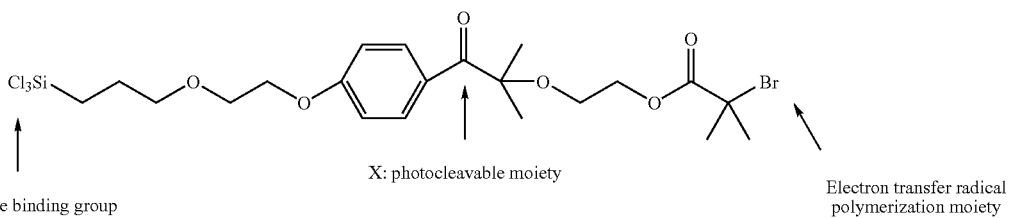
Q: substrate binding group
X: photocleavable moiety
Electron transfer radical polymerization moiety
2.
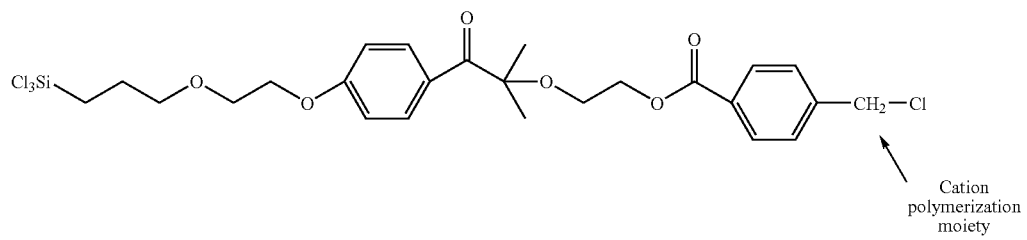
Cation polymerization moiety
3.
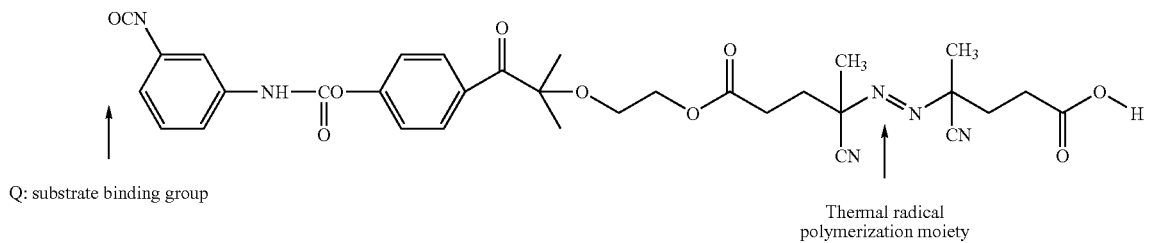
Q: substrate binding group
Thermal radical polymerization moiety
4.
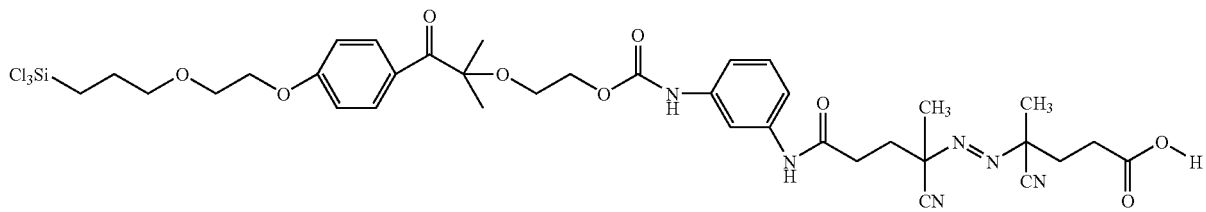
5.
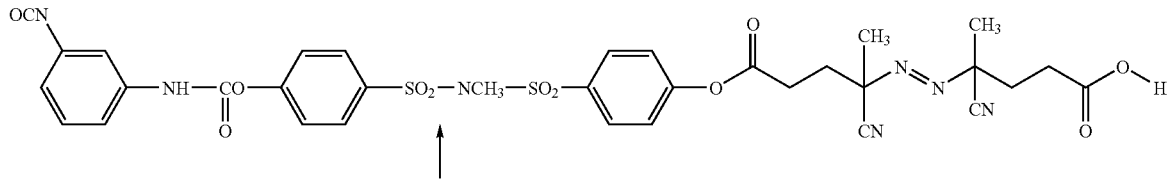
X: photocleavable moiety
6.
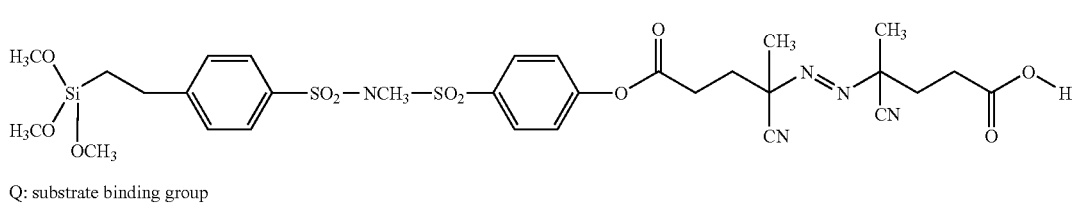
Q: substrate binding group -continued
7.
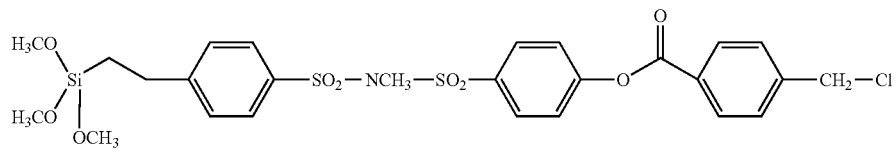
8.
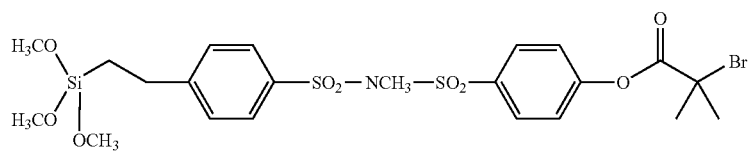
9.
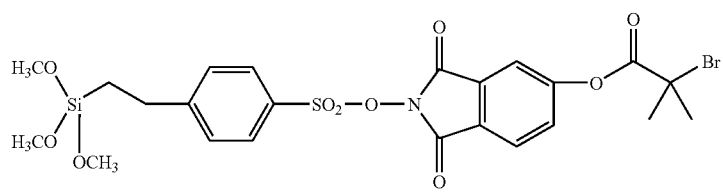
10.
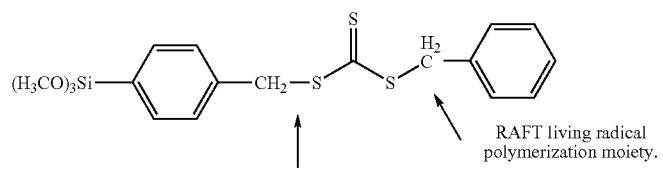
X: photocleavable moiety
RAFT living radical polymerization moiety.
\* \* \* \* \*